US012785554B2

(12) United States Patent
Oh

(10) Patent No.: US 12,785,554 B2
(45) Date of Patent: Nov. 3, 2026

(54) CHARGE PUMP CIRCUIT AND MEMORY DEVICE INCLUDING THE SAME

(71) Applicant: Samsung Electronics Co., Ltd., Suwon-si (KR)

(72) Inventor: Jungkyun Oh, Suwon-si (KR)

(73) Assignee: SAMSUNG ELECTRONICS CO., LTD., Suwon-si Gyeonggi-do (KR)

( * ) Notice: Subject to any disclaimer, the term of this patent is extended or adjusted under 35 U.S.C. 154(b) by 37 days.

(21) Appl. No.: 19/003,598

(22) Filed: Dec. 27, 2024

(65) Prior Publication Data

US 2025/0266761 A1 Aug. 21, 2025

(30) Foreign Application Priority Data

Feb. 19, 2024 (KR) ........................ 10-2024-0023666
Jul. 2, 2024 (KR) ........................ 10-2024-0087046

(51) Int. Cl.
*H02M 3/07* (2006.01)
*G11C 11/4074* (2006.01)

(52) U.S. Cl.
CPC ......... *H02M 3/073* (2013.01); *G11C 11/4074* (2013.01)

(58) Field of Classification Search
CPC ........................... H02M 3/073; G11C 11/4074
USPC .......................................................... 365/226
See application file for complete search history.

(56) References Cited

U.S. PATENT DOCUMENTS

| | | | | |
|---|---|---|---|---|
| 6,107,864 A * | 8/2000 | Fukushima | H02M 3/073 363/60 |
| 7,098,725 B2 | 8/2006 | Lee | |
| 8,106,703 B2 * | 1/2012 | Nagai | H02M 3/073 327/536 |
| 11,437,907 B2 | 9/2022 | Aker et al. | |
| 2007/0109035 A1 | 5/2007 | Tsivyan | |
| 2009/0213669 A1 * | 8/2009 | Lee | G11C 16/12 365/189.11 |
| 2011/0050327 A1 * | 3/2011 | Fujitani | H02M 3/07 327/536 |

(Continued)

FOREIGN PATENT DOCUMENTS

| | | |
|---|---|---|
| CN | 107911019 B | 4/2020 |
| CN | 111509973 B | 4/2022 |
| CN | 116961406 A | 10/2023 |

(Continued)

*Primary Examiner* — Amir Zarabian
*Assistant Examiner* — Daniel John King
(74) *Attorney, Agent, or Firm* — Muir Patent Law, PLLC

(57) ABSTRACT

A charge pump circuit may include a first pumping stage including a first pumping capacitor, a first transmission stage including a first transmission transistor, a second pumping stage including a second pumping capacitor and a N-type transistor connected between a first node and an output node of an inverter, and a second transmission stage including a second transmission transistor. In a pumping mode operation, the first pumping capacitor pumps an input voltage to a first voltage, the first transmission transistor transmits the first voltage to the first node, the second pumping capacitor pumps the first voltage to a second voltage, and the second transmission transistor transmits the second voltage to an output node of the charge pump circuit as an output voltage. A voltage level of drain-source of the first N-type transistor may be the same as a level of the input voltage.

20 Claims, 11 Drawing Sheets

10

(56) References Cited

U.S. PATENT DOCUMENTS

| | | | | |
|---|---|---|---|---|
| 2022/0393579 | A1* | 12/2022 | Pulvirenti | H02M 1/0095 |
| 2023/0343382 | A1* | 10/2023 | Oh | G11C 11/4074 |

FOREIGN PATENT DOCUMENTS

| | | | |
|---|---|---|---|
| KR | 10-2281629 | B1 | 7/2021 |
| KR | 10-2023-0151343 | A | 11/2023 |
| TW | 202343442 | A | 11/2023 |

* cited by examiner

130B

CHARGE PUMP CIRCUIT AND MEMORY DEVICE INCLUDING THE SAME

CROSS-REFERENCE TO RELATED APPLICATION(S)

This application is based on and claims priority under 35 U.S.C. § 119 to Korean Patent Application Nos. 10-2024-0023666 filed on Feb. 19, 2024, and 10-2024-0087046 filed on Jul. 2, 2024, in the Korean Intellectual Property Office, the disclosure of each of which is incorporated by reference herein in its entirety.

BACKGROUND

The inventive concept relates to an electronic apparatus, and more particularly, to a multi-stage boosting charge pump circuit and a memory device including the same.

Semiconductor memory devices may be largely classified into volatile semiconductor memory devices and non-volatile semiconductor memory devices. The volatile semiconductor memory devices have a quick reading and writing speed but lose content stored therein if power thereto is turned off. However, the non-volatile semiconductor memory devices preserve content therein even when power thereto is turned off. Therefore, the non-volatile semiconductor memory devices are used to store content to be preserved regardless of whether power is supplied thereto. The semiconductor memory devices are widely used for driving or storage of electronic apparatuses, such as computers and smartphones. Techniques to reduce a chip size for high capacity and high integration of semiconductor memory devices have been developed.

In a general electronic circuit concept, it may not be expected to obtain an output voltage having a higher potential than a power source voltage. However, in a semiconductor memory device, a voltage having a higher potential than a power source voltage is frequently required. For example, when a cell capacitor is charged by a bit line voltage in a semiconductor memory device, voltage drop occurs in the bit line voltage by the threshold voltage of a cell transistor. In this case, if the gate of the cell transistor is driven at a boosting voltage much higher than a power source voltage, the voltage drop described above does not occur. In addition, the boosting voltage may be used in a sense amplifier, a data output buffer, and the like.

A charge pump circuit may supply a boosting voltage in a semiconductor memory device. The charge pump circuit is a type of direct current (DC)-DC converter and may generate a voltage higher than an input voltage or lower than a ground voltage. The charge pump circuit may use a plurality of capacitors as an energy storage device and include a plurality of switches driven in response to a clock signal. Therefore, it is desired that the charge pump circuit may be needed small size, high reliability and high pumping operation speed.

SUMMARY

The inventive concept provides a charge pump for generating an output voltage corresponding to multiple times an input voltage at one clock cycle and a memory device including the same.

In addition, according to the inventive concept, a second pumping stage of a charge pump circuit includes two inverters, and the charge pump circuit may control the logic levels of a clock signal and an inverted clock signal to be provided to the two inverters, to maintain, as an input voltage, a voltage applied to a transistor included in the second pumping stage, thereby preventing deterioration and ensuring reliability.

According to an aspect of the inventive concept, there is provided a charge pump circuit including a plurality of pumping stages including a first pumping stage and a second pumping stage and a plurality of transmission stages including a first transmission stage and a second transmission stage. The first pumping stage includes a first pumping capacitor having one end to which a clock signal is applied and the other end connected to a first node, a second pumping capacitor having one end to which an inverted clock signal is applied and the other end connected to a second node, a first N-type transistor including a first end connected to the first node, a second end to which an input voltage is applied, and a gate to which the input voltage or a first voltage having twice the level of the input voltage is applied, and a second N-type transistor including a first end connected to the second node, a second end to which the input voltage is applied, and a gate to which the input voltage or the first voltage is applied. The first transmission stage transmits a voltage of the first node to a third node in response to the clock signal having a logic high level, and transmits a voltage of the second node to a fourth node in response to the inverted clock signal having the logic high level. The second pumping stage includes a third pumping capacitor having one end connected to the third node and the other end connected to a fifth node, a fourth pumping capacitor having one end connected to the fourth node and the other end connected to a sixth node, a first inverter and a second inverter, a third N-type transistor including a first end connected to the third node and a second end connected to an output node of the first inverter, and a fourth N-type transistor including a first end connected to the fourth node and a second end connected to an output node of the second inverter. The second transmission stage transmits a voltage of the fifth node to an output node of the charge pump circuit in response to the clock signal has the logic high level, and transmits a voltage of the sixth node to the output node of the charge pump circuit in response to the inverted clock signal having the logic high level. In response to the clock signal having the logic high level, a voltage difference between a voltage applied to the first end of the third N-type transistor and a voltage applied to the second end of the third N-type transistor is the same as a level of the input voltage and a voltage difference between a voltage applied to the first end of the fourth N-type transistor and a voltage applied to the second end of the fourth N-type transistor is the same as a level of a ground voltage. In response to the clock signal having a logic low level, the voltage difference between a voltage applied to the first end of the third N-type transistor and a voltage applied to the second end of the third N-type transistor is the same as the level of the ground voltage, and the voltage difference between a voltage applied to the first end of the fourth N-type transistor and a voltage applied to the second end of the fourth N-type transistor is the same as the level of the input voltage.

According to another aspect of the inventive concept, there is provided a memory device including a memory cell array including a plurality of memory cells and a peripheral circuit including a charge pump circuit configured to receive a power source voltage from outside the memory device and generate a high voltage corresponding to multiple times the power source voltage. The charge pump circuit includes a plurality of pumping stages including a first pumping stage and a second pumping stage and a plurality of transmission stages including a first transmission stage and a second transmission stage. The first pumping stage includes a first pumping capacitor having one end to which a clock signal is applied and the other end connected to a first node, a second pumping capacitor having one end to which an inverted clock signal is applied and the other end connected to a second node, a first N-type transistor including a first end connected to the first node, a second end to which an input voltage or a first voltage having twice the level of the input voltage is applied, and a gate to which the input voltage or a first voltage having twice the level of the input voltage is applied, and a second N-type transistor including a first end connected to the second node, a second end to which the input voltage is applied, and a gate to which the input voltage or the first voltage is applied. The first transmission stage transmits a voltage of the first node to a third node in response to the clock signal having a logic high level, and transmits a voltage of the second node to a fourth node in response to the inverted clock signal having the logic high level. The second pumping stage includes a third pumping capacitor having one end connected to the third node and the other end connected to a fifth node, a fourth pumping capacitor having one end connected to the fourth node and the other end connected to a sixth node, a first inverter and a second inverter, a third N-type transistor including a first end connected to the third node and a second end connected to an output node of the first inverter, and a fourth N-type transistor including a first end connected to the fourth node and a second end connected to an output node of the second inverter. The second transmission stage transmits a voltage of the fifth node to an output node of the charge pump circuit in response to the clock signal having the logic high level, and transmits a voltage of the sixth node to the output node of the charge pump circuit in response to the inverted clock signal having the logic high level. In response to the clock signal having the logic high level, a voltage difference between a voltage applied to the first end of the third N-type transistor and a voltage applied to the second end of the third N-type transistor is the same as a level of the input voltage and a voltage difference between a voltage applied to the first end of the fourth N-type transistor and a voltage applied to the second end of the fourth N-type transistor is the same as a level of a ground voltage. In response to the clock signal having a logic low level, the voltage difference between a voltage applied to the first end of the third N-type transistor and a voltage applied to the second end of the third N-type transistor is the same as the level of the ground voltage, and the voltage difference between a voltage applied to the first end of the fourth N-type transistor and a voltage applied to the second end of the fourth N-type transistor is the same as the level of the input voltage.

According to another aspect of the inventive concept, there is provided a charge pump circuit including a plurality of pumping stages including a first pumping stage and a second pumping stage and a plurality of transmission stages including a first transmission stage and a second transmission stage. The first pumping stage includes a first pumping capacitor having one end to which a clock signal is applied and the other end connected to a first node, a second pumping capacitor having one end to which an inverted clock signal is applied and the other end connected to a second node, a first N-type transistor including a first end connected to the first node, a second end to which an input voltage is applied, and a gate to which the input voltage or a first voltage having twice the level of the input voltage is applied, and a second N-type transistor including a first end connected to the second node, a second end to which the input voltage is applied, and a gate to which the input voltage or a first voltage having twice the level of the input voltage is applied. The first transmission stage transmits a voltage of the first node to a third node if the clock signal has a logic high level, and transmits a voltage of the second node to a fourth node if the inverted clock signal has the logic high level. The second pumping stage includes a third pumping capacitor having one end connected to the third node and the other end connected to a fifth node, a fourth pumping capacitor having one end connected to the fourth node and the other end connected to a sixth node, a first inverter and a second inverter, a third N-type transistor including a first end connected to the third node and a second end connected to an output node of the first inverter, and a fourth N-type transistor including a first end connected to the fourth node and a second end connected to an output node of the second inverter. The second transmission stage transmits a voltage of the fifth node to an output node of the charge pump circuit in response to the clock signal having the logic high level, and transmits a voltage of the sixth node to the output node of the charge pump circuit in response to the inverted clock signal having the logic high level, the first inverter includes a first transistor including a first end to which the input voltage is applied, a second end connected to the second end of the third N-type transistor, and a gate to which the inverted clock signal is applied and a second transistor including a first end to which a ground voltage is applied, a second end connected to the second end of the third N-type transistor, and a gate to which the inverted clock signal is applied, the second inverter includes a third transistor including a first end to which the ground voltage is applied, a second end connected to the second end of the fourth N-type transistor, and a gate to which the clock signal is applied and a fourth transistor including a first end to which the input voltage is applied, a second end connected to the second end of the fourth N-type transistor, and a gate to which the clock signal is applied. In response to the clock signal having the logic high level, a voltage difference between a voltage applied to the first end of the third N-type transistor and a voltage applied to the second end of the third N-type transistor is the same as a level of the input voltage and a voltage of the fourth N-type transistor is the same as a level of the ground voltage. In response to the clock signal having a logic low level, the voltage difference between a voltage applied to the first end of the third N-type transistor and a voltage applied to the second end of the third N-type transistor is the same as a level of the ground voltage, and the voltage difference between a voltage applied to the first end of the fourth N-type transistor and a voltage applied to the second end of the fourth N-type transistor is the same as the level of the input voltage.

The effects, which may be obtained from the embodiments, are not limited to the effects mentioned above, and the other effects not mentioned above could be clearly derived and understood by those of ordinary skill in the art to which the embodiments belong from the description below. That is, unintended effects according to carrying out the embodiments could also be derived by those of ordinary skill in the art from the embodiments.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments are described in detail with reference to the accompanying drawings.

Figure 1:
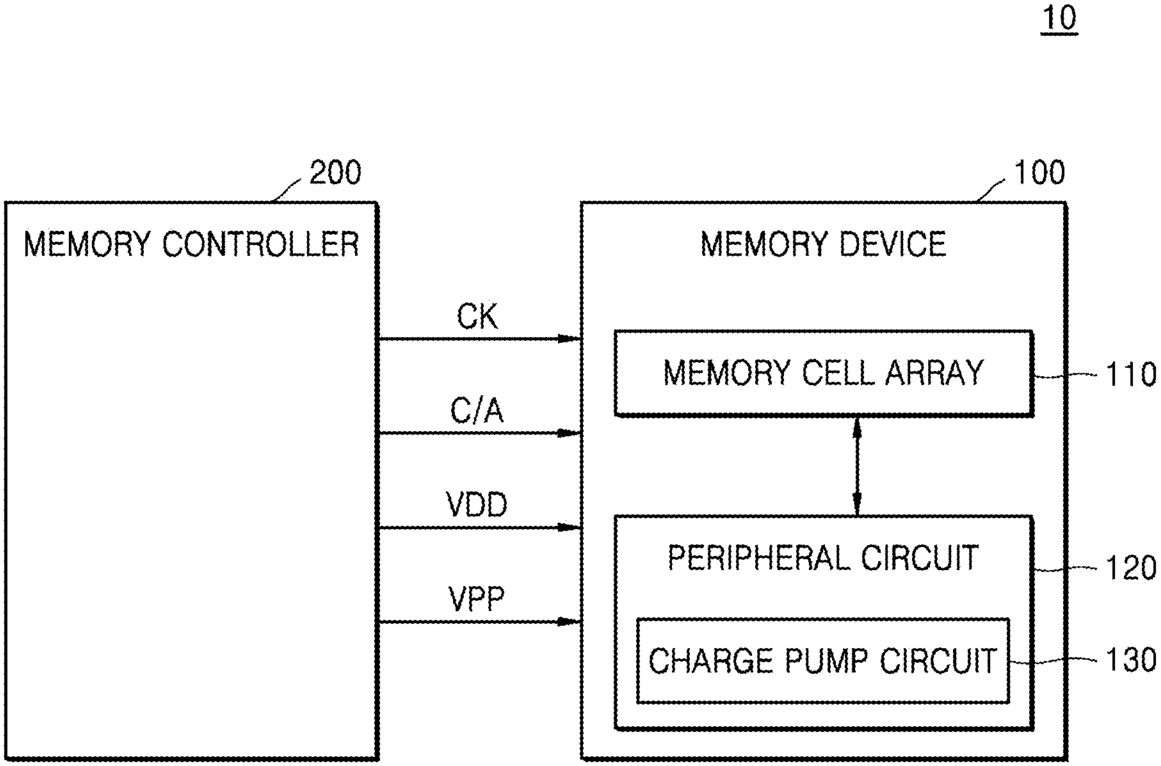
FIG. 1 is a block diagram illustrating a memory system according to an embodiment.

FIG. 1 is a block diagram illustrating a memory system 10 according to an embodiment.

Referring to FIG. 1, the memory system 10 may include a memory controller 200 and a memory device 100, and the memory device 100 may include a memory cell array 110 and a peripheral circuit 120.

The memory system 10 may be coupled to a host and accessed by the host. The memory system 10 is a functional block configured to perform a general computer operation in an electronic apparatus and may correspond to a central processing unit (CPU), a digital signal processor (DSP), a graphics processing unit (GPU), or an application processor (AP).

The memory controller 200 may generally control an operation of the memory system 10 and control general data exchange between an external host and the memory device 100. For example, the memory controller 200 may write or read data by controlling the memory device 100 in response to a request from the host. In addition, the memory controller 200 may control an operation of the memory device 100 by applying an operation command for controlling the memory device 100.

The memory controller 200 may transmit a clock signal CK and a command/address C/A to the memory device 100 and provide a power source voltage VDD and a core power source voltage VPP to the memory device 100. In addition, the memory controller 200 may exchange data with the memory device 100.

The memory device 100 may include, for example, dynamic random access memory (DRAM) but is not limited thereto. For example, the memory device 100 may correspond to double data rate synchronous dynamic random access memory (DDR SDRAM), low power double data rate (LPDDR) SDRAM, graphics double data rate (GDDR) SDRAM, Rambus dynamic random access memory (RDRAM), or the like. Alternatively, the memory device 100 may be implemented by static random access memory (SRAM), high bandwidth memory (HBM), or processor in memory (PIM).

The memory device 100 may include the memory cell array 110 and the peripheral circuit 120, and the peripheral circuit 120 may include a charge pump circuit 130.

The memory cell array 110 may include a plurality of rows, a plurality of columns, and a plurality of memory cells formed at intersections of the plurality of rows and the plurality of columns. A memory cell of the memory cell array 110 may be a volatile memory cell, e.g., a DRAM cell.

The peripheral circuit 120 may receive the command/address C/A and data from the memory controller 200 and store the data in the memory cell array 110 through an internal operation. In additional, the peripheral circuit 120 may read data stored in the memory cell array 110 and provide the read data to the memory controller 200. In addition, the peripheral circuit 120 may receive external power through the power source voltage VDD and the core power source voltage VPP and generate internal power used for an internal operation, such as read or write.

According to an embodiment, the peripheral circuit 120 may include the charge pump circuit 130 to generate various levels of internal power. The charge pump circuit 130 may be referred to as a voltage generator. The charge pump circuit 130 may include a plurality of capacitors and a plurality of transistors. The charge pump circuit 130 may include a cross coupled charge pump structure and a heap type operation pump structure, thereby reducing a chip size and improving a circuit characteristic. The structure of the charge pump circuit 130 is described below in detail with reference to FIGS. 3 and 4.

Figure 2:
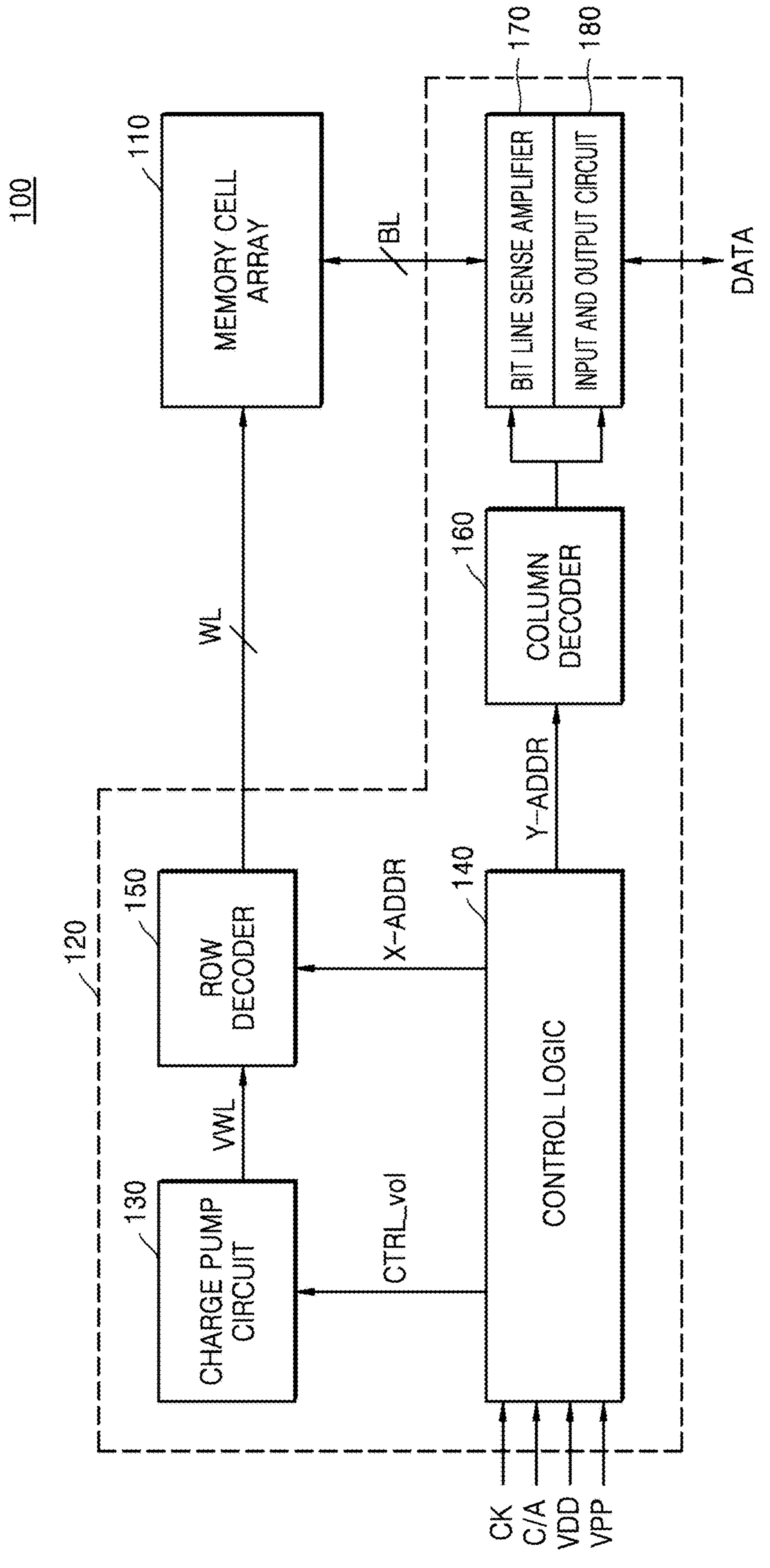
FIG. 2 is a block diagram illustrating a memory device according to an embodiment.

FIG. 2 is a block diagram illustrating the memory device 100 according to an embodiment.

Referring to FIG. 2, the memory device 100 may include the memory cell array 110 and the peripheral circuit 120. The peripheral circuit 120 may include the charge pump circuit 130, a control logic 140, a row decoder 150, a column decoder 160, a bit line sense amplifier 170, and an input and output circuit 180.

The control logic 140 may receive the clock signal CK and the command/address C/A from the memory controller 200 (see FIG. 1) through a channel. The control logic 140 may receive the power source voltage VDD and the core power source voltage VPP from the outside, the core power source voltage VPP being higher than the power source voltage VDD. The control logic 140 may generate an inverted clock signal based on the clock signal CK. For example, the inverted clock signal may be an inverted signal of the clock signal CK. The control logic 140 may generate control signals used to control the memory device 100. For example, the control logic 140 may output a voltage control signal CTRL_vol, a row address X-ADDR, and a column address Y-ADDR. The control logic 140 may generally control various kinds of operations of the memory device 100. For example, a memory operation may be performed at an operation timing of the control logic 140.

The row decoder 150 may receive the row address X-ADDR from the control logic 140. The row decoder 150 may be connected to the memory cell array 110 through a plurality of word lines WL. The row decoder 150 may select one of the plurality of word lines WL in response to control by the control logic 140.

The column decoder 160 may receive the column address Y-ADDR from the control logic 140. The column decoder 160 may select a corresponding one of a plurality of bit lines BL by decoding the column address Y-ADDR.

The bit line sense amplifier 170 may write or read data DATA in or from the memory cell array 110. The bit line sense amplifier 170 may be connected to the selected bit line BL among the plurality of bit lines BL according to the received column address Y-ADDR.

The input and output circuit 180 may provide data DATA read from the memory cell array 110 to the outside, e.g., the memory controller 200 (see FIG. 1), of the memory device 100 or provide data DATA received from the outside to the bit line sense amplifier 170.

The charge pump circuit 130 may generate a voltage used for an operation of the memory device 100. The charge pump circuit 130 may generate various types of voltages for performing operations of the memory cell array 110, based on the voltage control signal CTRL_vol. For example, the charge pump circuit 130 may generate an output voltage Vout (see FIG. 3) as a word line enable voltage VWL. The charge pump circuit 130 may generate an output voltage corresponding to multiple times an input voltage.

Figure 3:
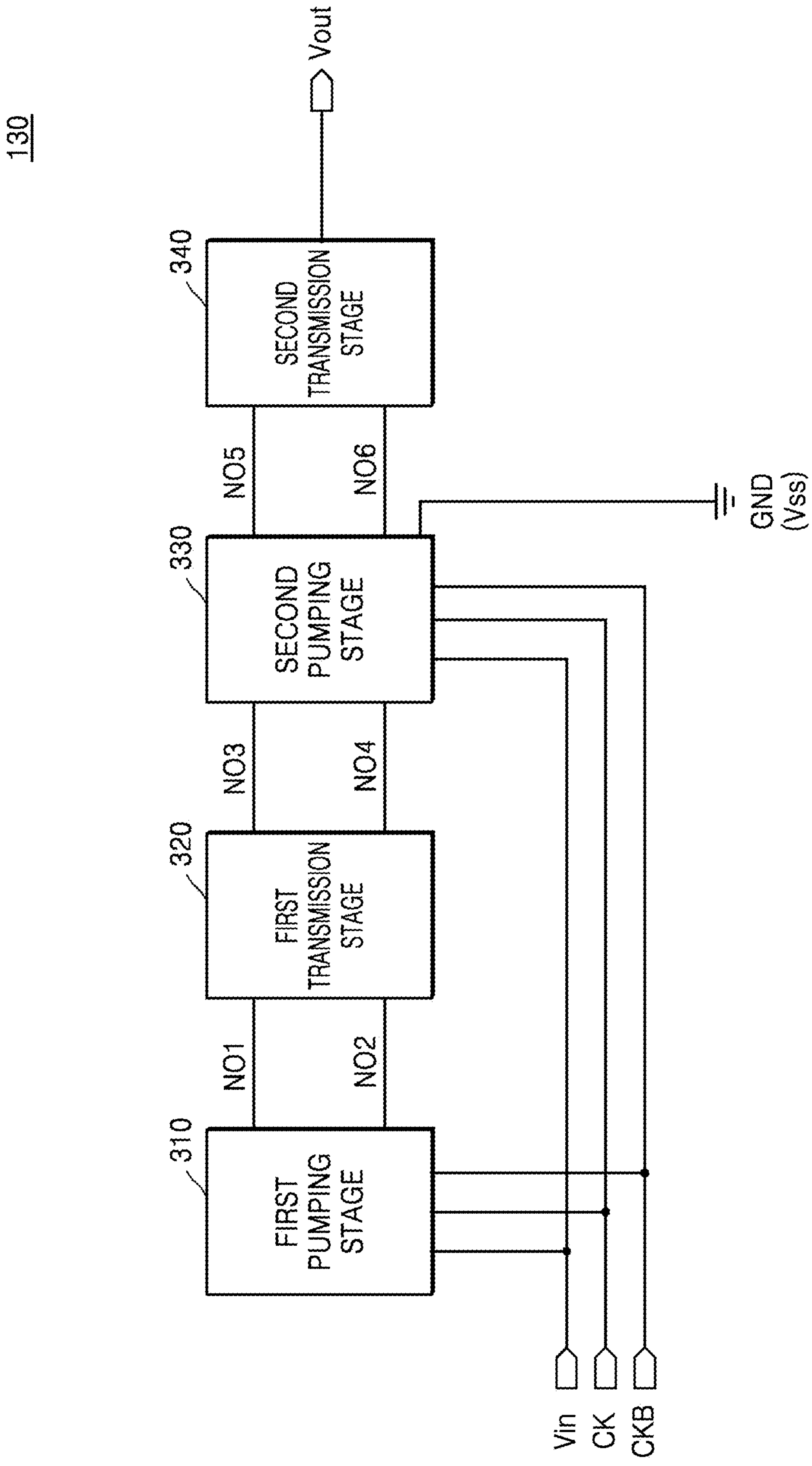
FIG. 3 is a block diagram illustrating a charge pump circuit according to an embodiment.

FIG. 3 is a block diagram illustrating the charge pump circuit 130 according to an embodiment.

Referring to FIG. 3, the charge pump circuit 130 may generate an output voltage Vout (e.g., an internal high voltage of the memory device 100 of FIG. 1 or the memory cell array 110 of FIG. 2 or the word line enable voltage VWL) that is a high voltage based on an input voltage Vin (e.g., the core power source voltage VPP of FIG. 1 or 2) that is a low voltage. The charge pump circuit 130 may include a plurality of pumping stages and a plurality of transmission stages.

According to an embodiment, the charge pump circuit 130 may include a first pumping stage 310, a first transmission stage 320, a second pumping stage 330, and a second transmission stage 340. However, the invention is not limited thereto, and the charge pump circuit 130 may include n pumping stages and n transmission stages (herein, n is a natural number of 3 or greater).

The charge pump circuit 130 may generate the output voltage Vout corresponding to multiple times the input voltage Vin. Hereinafter, for convenience of description, it is assumed that the charge pump circuit 130 generates the output voltage Vout corresponding to three times the input voltage Vin and includes the first pumping stage 310, the first transmission stage 320, the second pumping stage 330, and the second transmission stage 340.

The first pumping stage 310 may be connected to the first transmission stage 320 through a first node NO1 and a second node NO2. The first transmission stage 320 may be connected to the second pumping stage 330 through a third node NO3 and a fourth node NO4. The second pumping stage 330 may be connected to the second transmission stage 340 through a fifth node NO5 and a sixth node NO6. The second transmission stage 340 may be connected to an output node. The input voltage Vin may be applied to the first pumping stage 310 and the second pumping stage 330. The clock signal CK may be applied to the first pumping stage 310 and the second pumping stage 330. An inverted clock signal CKB may be applied to the first pumping stage 310 and the second pumping stage 330. The second pumping stage 330 may be connected to a ground node GND. The output voltage Vout may be output through the second transmission stage 340.

According to an embodiment, based on the clock signal CK and the inverted clock signal CKB, a portion of the charge pump circuit 130 may operate in a pumping mode and the other portion thereof may operate in a pre-charge mode. For example, when the clock signal CK has a logic high level and the inverted clock signal CKB has a logic low level, devices connected to the first node NO1, the third node NO3, and the fifth node NO5 may operate in the pumping mode, and devices connected to the second node NO2, the fourth node NO4, and the sixth node NO6 may operate in the pre-charge mode. For example, on the contrary, when the clock signal CK has the logic low level and the inverted clock signal CKB has the logic high level, the devices connected to the first node NO1, the third node NO3, and the fifth node NO5 may operate in the pre-charge mode, and the devices connected to the second node NO2, the fourth node NO4, and the sixth node NO6 may operate in the pumping mode. For example, the devices connected to the first node NO1, the third node NO3, and the fifth node NO5 and the devices connected to the second node NO2, the fourth node NO4, and the sixth node NO6 in the charge pump circuit 130 may complementarily operate mutually, and the output voltage Vout may be constantly output.

According to an embodiment, the charge pump circuit 130 may generate the output voltage Vout corresponding to multiple times the input voltage Vin. For example, when the clock signal CK has the logic high level and the inverted clock signal CKB has the logic low level, the voltage levels of the first node NO1 and the third node NO3 may be boosted to twice the input voltage Vin, the voltage levels of the second node NO2 and the sixth node NO6 may be pre-charged to the input voltage Vin, the voltage level of the fourth node NO4 may be pre-charged to a ground voltage Vss, and the voltage level of the fifth node NO5 may be boosted to three times the input voltage Vin. For example, when the clock signal CK has the logic low level and the inverted clock signal CKB has the logic high level, the voltage levels of the first node NO1 and the fifth node NO5 may be boosted to the input voltage Vin, the voltage levels of the second node NO2 and the fourth node NO4 may be pre-charged to twice the input voltage Vin, the voltage level of the third node NO3 may be pre-charged to the ground voltage Vss, and the voltage level of the sixth node NO6 may be boosted to three times the input voltage Vin.

In the pumping mode, the first pumping stage 310 may boost the input voltage Vin by the input voltage Vin and the first transmission stage 320 may transmit the voltage of the first node NO1 or the second node NO2 to the third node NO3 or the fourth node NO4. The second pumping stage 330 may boost the voltage levels of the third node NO3 and the fourth node NO4 by the input voltage Vin. The second transmission stage 340 may transmit the voltages of the fifth node NO5 and the sixth node NO6 to the output node.

The first pumping stage 310, the first transmission stage 320, the second pumping stage 330, and the second transmission stage 340 may simultaneously operate for one clock cycle, and the output voltage Vout may be boosted to a target voltage (e.g., a high voltage corresponding to multiple times the input voltage Vin) in one clock cycle. For example, the output voltage Vout may be a voltage corresponding to three times the input voltage Vin for one clock cycle. For example, the one clock cycle may be defined as a time interval between rising edges or falling edges of a repetitive clock signal.

For example, the charge pump circuit 130 according to an embodiment may simultaneously receive the clock signal CK and the inverted clock signal CKB to boost the input voltage Vin to the output voltage Vout, thereby minimizing a voltage loss and improving a pumping operation speed.

Figure 4:
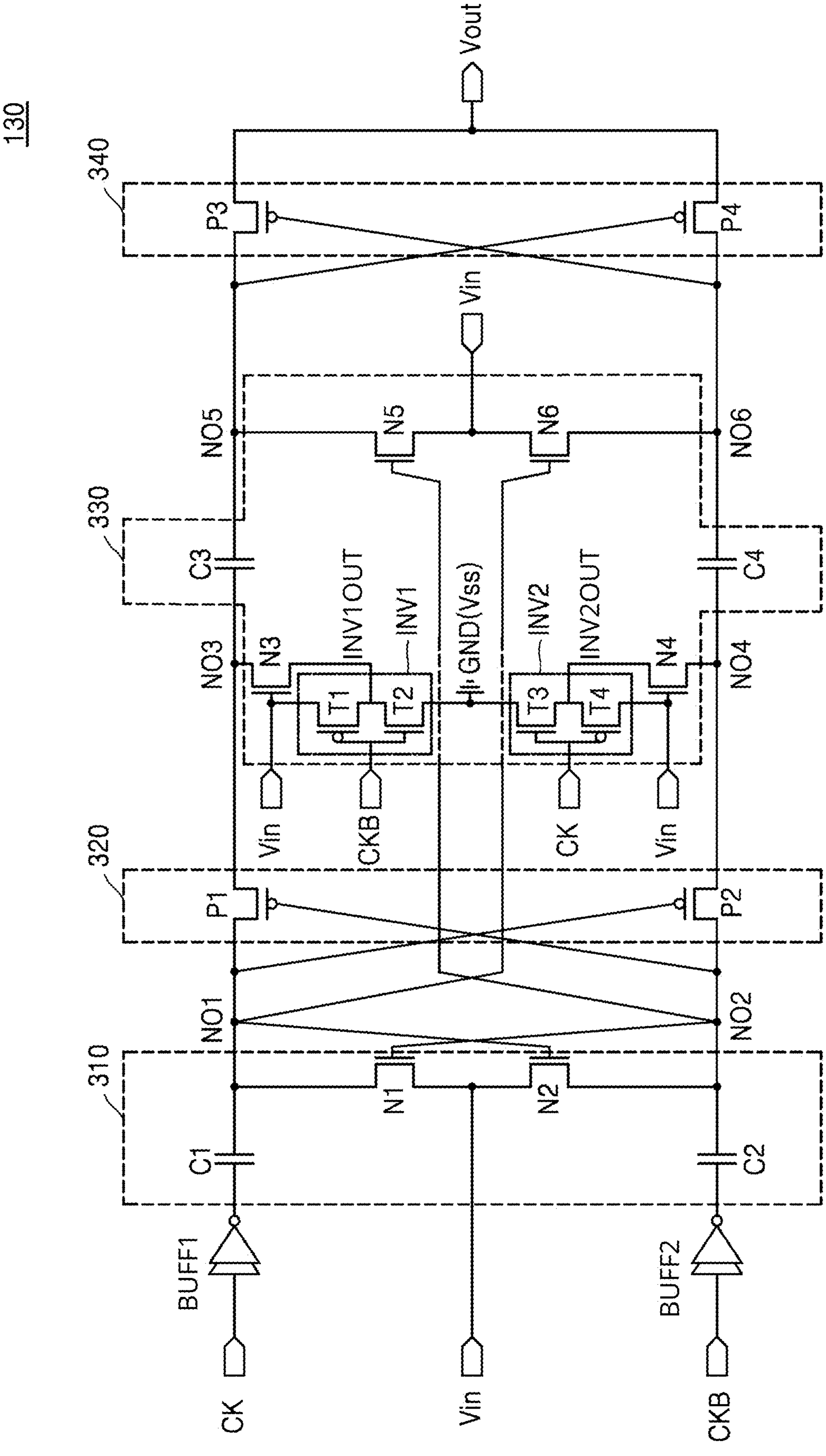
FIG. 4 is a circuit diagram illustrating a charge pump circuit according to an embodiment.

FIG. 4 is a circuit diagram illustrating the charge pump circuit 130 according to an embodiment.

Referring to FIG. 4, the charge pump circuit 130 may include the first pumping stage 310, the first transmission stage 320, the second pumping stage 330, and the second transmission stage 340. The charge pump circuit 130 may generate the output voltage Vout that is a high voltage by boosting the input voltage Vin based on the clock signal CK and the inverted clock signal CKB. The first pumping stage 310 may be connected to the first transmission stage 320 through the first node NO1 and the second node NO2. The first transmission stage 320 may be connected to the second pumping stage 330 through the third node NO3 and the fourth node NO4. The second pumping stage 330 may be connected to the second transmission stage 340 through the fifth node NO5 and the sixth node NO6.

The first pumping stage 310 may include a first pumping capacitor C1, a second pumping capacitor C2, a first N-type transistor N1, and a second N-type transistor N2. The first pumping capacitor C1 may have one end to which the clock signal CK is applied and the other end connected to the first node NO1. For example, the first pumping capacitor C1 may receive the clock signal CK through a first buffer BUFF1. The first buffer BUFF1 may include two inverters connected in series. The second pumping capacitor C2 may have one end to which the inverted clock signal CKB is applied and the other end connected to the second node NO2. For example, the second pumping capacitor C2 may receive the inverted clock signal CKB through a second buffer BUFF2. The second buffer BUFF2 may include two inverters connected in series. The first N-type transistor N1 may include one end connected to the first node NO1, the other end to which the input voltage Vin is applied, and a gate connected to the second node NO2. Hereinafter, the one end of transistor may be referred to as a first end of the transistor and the other end of the transistor may be referred to as a second end of the transistor. The second N-type transistor N2 may include one end connected to the second node NO2, the other end to which the input voltage Vin is applied, and a gate connected to the first node NO1.

The first transmission stage 320 may include a first P-type transistor P1 and a second P-type transistor P2. The first P-type transistor P1 may include one end connected to the first node NO1, the other end connected to the third node NO3, and a gate connected to the second node NO2. The second P-type transistor P2 may include one end connected to the second node NO2, the other end connected to the fourth node NO4, and a gate connected to the first node NO1.

The second pumping stage 330 may include a third pumping capacitor C3, a fourth pumping capacitor C4, a third N-type transistor N3, a fourth N-type transistor N4, a fifth N-type transistor N5, a sixth N-type transistor N6, a first inverter INV1, and a second inverter INV2. The third pumping capacitor C3 may have one end connected to the third node NO3 and the other end connected to the fifth node NO5. The fourth pumping capacitor C4 may have one end connected to the fourth node NO4 and the other end connected to the sixth node NO6. The third N-type transistor N3 may include one end connected to an output node INV1OUT of the first inverter INV1, the other end connected to the third node NO3, and a gate to which the input voltage Vin is applied. The fourth N-type transistor N4 may include one end connected to an output node INV2OUT of the second inverter INV2, the other end connected to the fourth node NO4, and a gate to which the input voltage Vin is applied. The fifth N-type transistor N5 may include one end connected to the fifth node NO5, the other end to which the input voltage Vin is applied, and a gate connected to the second node NO2. The sixth N-type transistor N6 may include one end connected to the sixth node NO6, the other end to which the input voltage Vin is applied, and a gate connected to the first node NO1.

The first inverter INV1 may include a first transistor T1 and a second transistor T2, and the second inverter INV2 may include a third transistor T3 and a fourth transistor T4. The first transistor T1 may include one end to which the input voltage Vin is applied, the other end connected to the one end of the third N-type transistor N3 in the output node INV1OUT, and a gate to which the inverted clock signal CKB is applied. The second transistor T2 may include one end connected to the ground node GND, the other end connected to the one end of the third N-type transistor N3, and a gate to which the inverted clock signal CKB is applied. The third transistor T3 may include one end connected to the ground node GND, the other end connected the one end of the fourth N-type transistor N4 in the output node INV2OUT, and a gate to which the clock signal CK is applied. The fourth transistor T4 may include one end to which the input voltage Vin is applied, the other end connected to the one end of the fourth N-type transistor N4, and a gate to which the clock signal CK is applied.

The second transmission stage 340 may include a third P-type transistor P3 and a fourth P-type transistor P4. The third P-type transistor P3 may include one end connected to the fifth node NO5, the other end connected to an output node, and a gate connected to the sixth node NO6. The fourth P-type transistor P4 may include one end connected to the sixth node NO6, the other end connected to the output node, and a gate connected to the fifth node NO5.

The charge pump circuit 130 may include a cross coupled structure. A portion and the other portion of the charge pump circuit 130 may mutually perform complementary operations. For example, when the first pumping capacitor C1 and the third pumping capacitor C3 operate in the pumping mode, the second pumping capacitor C2 and the fourth pumping capacitor C4 may operate in the pre-charge mode. In addition, when the first pumping capacitor C1 and the third pumping capacitor C3 operate in the pre-charge mode, the second pumping capacitor C2 and the fourth pumping capacitor C4 may operate in the pumping mode. An operation method of the charge pump circuit 130 is particularly described below with reference to FIGS. 5 and 6.

While each of pumping stages according to a comparative embodiment includes four or more capacitors, each of the first pumping stage 310 and the second pumping stage 330 according to an embodiment may include two pumping capacitors, thereby decreasing an area occupied by the pumping capacitors.

For example, the charge pump circuit 130 according to an embodiment may have a circuit area reduced compared to an existing cross-coupled charge pump circuit. In addition, the charge pump circuit 130 according to an embodiment may use an area reduced compared to charge pump circuits according to a comparative embodiment to generate the same output voltage Vout, thereby reducing a chip size.

Figure 5:
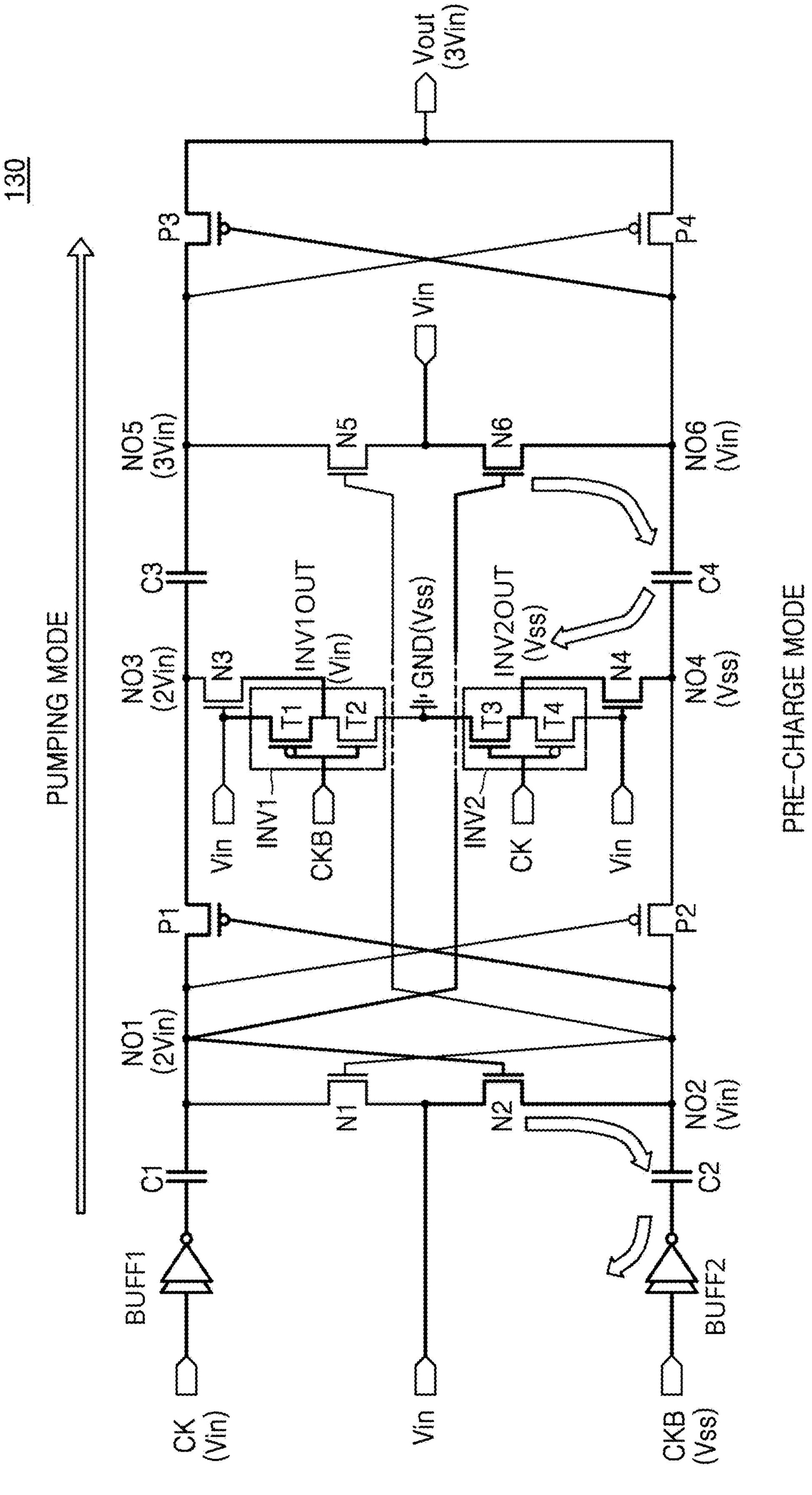
FIG. 5 is a circuit diagram illustrating an operation of the charge pump circuit of FIG. 4 according to an embodiment.

FIG. 5 is a circuit diagram illustrating an operation of the charge pump circuit 130 according to an embodiment.

Referring to FIG. 5, an operation of the charge pump circuit 130 when the clock signal CK of the logic high level and the inverted clock signal CKB of the logic low level are applied is shown.

When the clock signal CK has the logic high level and the inverted clock signal CKB has the logic low level, the first pumping capacitor C1 and the third pumping capacitor C3 may operate in the pumping mode, and the second pumping capacitor C2 and the fourth pumping capacitor C4 may operate in the pre-charge mode.

When the clock signal CK has the logic high level and the inverted clock signal CKB has the logic low level, the first N-type transistor N1, the second P-type transistor P2, the third N-type transistor N3, the fifth N-type transistor N5, the fourth P-type transistor P4, the second transistor T2, and the fourth transistor T4 may be turned off, and the second N-type transistor N2, the first P-type transistor P1, the fourth N-type transistor N4, the sixth N-type transistor N6, the third P-type transistor P3, the first transistor T1, and the third transistor T3 may be turned on.

The first pumping capacitor C1 and the third pumping capacitor C3 in the pumping mode may be connected in series to an output node. For example, the first pumping capacitor C1 and the third pumping capacitor C3 may be connected in series to the output node through the first P-type transistor P1 and the third P-type transistor P3 that are turned on. In this case, the voltage level of the first node NO1 may be boosted through the first pumping capacitor C1 to the level of a first voltage 2Vin having twice the level of the input voltage Vin. The first voltage 2Vin may be transmitted to the third node NO3 through the first P-type transistor P1, and the voltage level of the third node NO3 may be the level of the first voltage 2Vin. The voltage level of the fifth node NO5 may be boosted through the third pumping capacitor C3 to the level of a second voltage 3Vin having three times the level of the input voltage Vin. The second voltage 3Vin may be output as the output voltage Vout through the third P-type transistor P3. For example, the output voltage Vout may be the second voltage 3Vin.

The second pumping capacitor C2 and the fourth pumping capacitor C4 in the pre-charge mode may be pre-charged to the input voltage Vin and the ground voltage Vss, respectively. The second N-type transistor N2 may be turned on such that the second node NO2 is pre-charged to the input voltage Vin through the second N-type transistor N2. The fourth N-type transistor N4 may be turned on such that the fourth node NO4 is pre-charged to the ground voltage Vss through the third transistor T3 and the fourth N-type transistor N4. In this case, a voltage difference between a voltage applied to the one end of the fourth N-type transistor N4 and a voltage applied to the other end of the fourth N-type transistor N4 included in the second pumping stage may be the level of the ground voltage Vss. The sixth N-type transistor N6 may be turned on such that the sixth node NO6 is pre-charged to the input voltage Vin through the sixth N-type transistor N6.

In a pumping mode operation, the third N-type transistor N3, the second transistor T2 of the first inverter INV1 and the fourth transistor T4 of the second inverter INV2 may be turned off. In the pumping mode operation, the first transistor T1 of the first inverter INV1 and the third transistor T3 of the second inverter INV2 may be turned on. In the pumping mode operation, the voltage level of the output node INV1OUT connected to the first transistor T1 and the third N-type transistor N3 in common may be the level of the input voltage Vin. For example, in the pumping mode operation, the voltage level of the output node INV1OUT may be the level of the input voltage Vin by turning on of the first transistor T1.

According to an embodiment, when the clock signal CK has the logic high level and the inverted clock signal CKB has the logic low level, a voltage difference between a voltage applied to the one end of the third N-type transistor N3 and a voltage applied to the other end of the third N-type transistor N3 included in the second pumping stage may be the level of the input voltage Vin. Herein, the voltage difference may be Vds (drain-source voltage) of the third N-type transistor N3.

The second pumping stage may apply the inverted clock signal CKB of the logic low level to the gates of the first transistor T1 and the second transistor T2 and apply the clock signal CK of the logic high level to the gates of the third transistor T3 and the fourth transistor T4 to turn the first transistor T1 and the third transistor T3 on and turn the second transistor T2 and the fourth transistor T4 off. For example, in the pumping mode operation, the charge pump circuit 130 may control the voltage difference between a voltage applied to the one end of the third N-type transistor N3 and a voltage applied to the other end of the third N-type transistor N3 as the level of the input voltage Vin.

According to an embodiment, the second pumping stage may include the first inverter INV1 and the second inverter INV2 and, when the clock signal CK has the logic high level and the inverted clock signal CKB has the logic low level, control the first inverter INV1 to maintain the voltage difference between a voltage applied to the one end of the third N-type transistor N3 and a voltage applied to the other end of the third N-type transistor N3 at the level of the input voltage Vin.

Therefore, the charge pump circuit 130 according to an embodiment may control, as the input voltage Vin, a voltage difference between a voltage to be applied to the one end of the third N-type transistor N3 and a voltage to be applied to the other end of the third N-type transistor N3 used in the second pumping stage, thereby preventing device deterioration and ensuring reliability.

Figure 6:
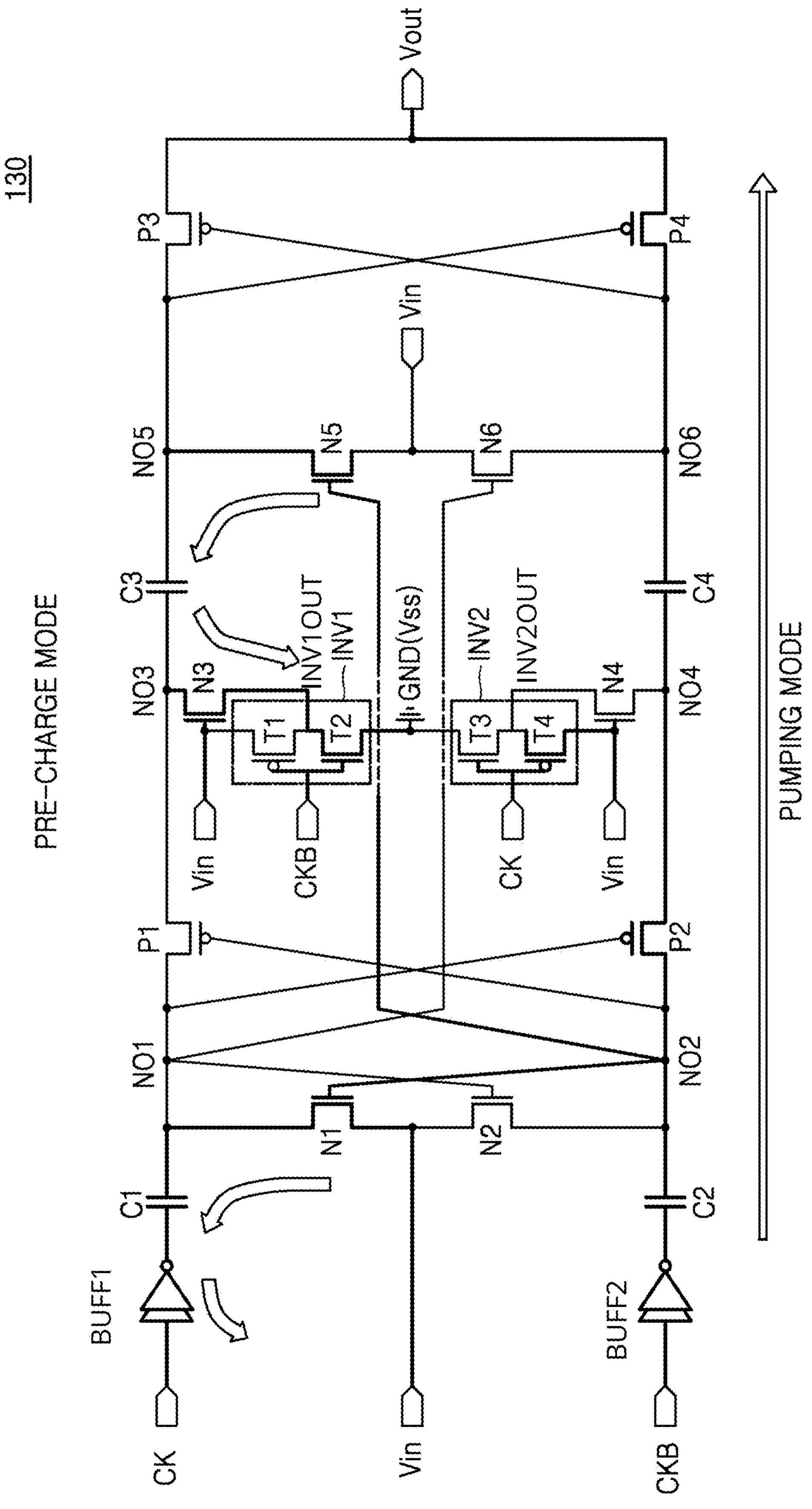
FIG. 6 is a circuit diagram illustrating an operation of the charge pump circuit of FIG. 4 according to an embodiment.

FIG. 6 is a circuit diagram illustrating an operation of the charge pump circuit 130 according to an embodiment.

Referring to FIG. 6, an operation of the charge pump circuit 130 when the clock signal CK of the logic low level and the inverted clock signal CKB of the logic high level are applied is shown.

When the clock signal CK has the logic low level and the inverted clock signal CKB has the logic high level, the second pumping capacitor C2 and the fourth pumping capacitor C4 may operate in the pumping mode, and the first pumping capacitor C1 and the third pumping capacitor C3 may operate in the pre-charge mode.

When the clock signal CK has the logic low level and the inverted clock signal CKB has the logic high level, the second N-type transistor N2, the first P-type transistor P1, the fourth N-type transistor N4, the sixth N-type transistor N6, the third P-type transistor P3, the first transistor T1, and the third transistor T3 may be turned off, and the first N-type transistor N1, the second P-type transistor P2, the third N-type transistor N3, the fifth N-type transistor N5, the fourth P-type transistor P4, the second transistor T2, and the fourth transistor T4 may be turned on.

The second pumping capacitor C2 and the fourth pumping capacitor C4 in the pumping mode may be connected in series to an output node. For example, the second pumping capacitor C2 and the fourth pumping capacitor C4 may be connected in series to the output node through the second P-type transistor P2 and the fourth P-type transistor P4 that are turned on. In this case, the voltage level of the second node NO2 may be boosted through the second pumping capacitor C2 to the first voltage 2Vin having twice the level of the input voltage Vin. The first voltage 2Vin may be transmitted to the fourth node NO4 through the second P-type transistor P2, and the voltage level of the fourth node NO4 may be the level of the first voltage 2Vin. The voltage level of the sixth node NO6 may be boosted through the fourth pumping capacitor C4 to the second voltage 3Vin having three times the level of the input voltage Vin. The second voltage 3Vin may be output as the output voltage Vout through the fourth P-type transistor P4. For example, the output voltage Vout may be the second voltage 3Vin.

The first pumping capacitor C1 and the third pumping capacitor C3 in the pre-charge mode may be pre-charged to the input voltage Vin and the ground voltage Vss, respectively. The first N-type transistor N1 may be turned on such that the first node NO1 is pre-charged to the input voltage Vin through the first N-type transistor N1. The third N-type transistor N3 may be turned on such that the third node NO3 is pre-charged to the ground voltage Vss through the third N-type transistor N3 and the second transistor T2. In this case, a voltage difference between a voltage applied to the one end of the third N-type transistor N3 and a voltage applied to the other end of the third N-type transistor N3 included in the second pumping stage may be the level of the ground voltage Vss. The fifth N-type transistor N5 may be turned on such that the fifth node NO5 is pre-charged to the input voltage Vin through the fifth N-type transistor N5.

In a pumping mode operation, the fourth N-type transistor N4 may be turned off and the first transistor T1 of the first inverter INV1 and the third transistor T3 of the second inverter INV2 may be turned off. In the pumping mode operation, the second transistor T2 of the first inverter INV1 and the fourth transistor T4 of the second inverter INV2 may be turned on. In the pumping mode operation, the voltage level of the output node INV2OUT connected to the fourth transistor T4 and the fourth N-type transistor N4 in common may be the level of the input voltage Vin. For example, in the pumping mode operation, the voltage level of the output node INV2OUT may be the level of the input voltage Vin by turning on of the fourth transistor T4.

According to an embodiment, when the clock signal CK has the logic low level and the inverted clock signal CKB has the logic high level, a voltage difference between a voltage applied to the one end of the fourth N-type transistor N4 and a voltage applied to the other end of the fourth N-type transistor N4 included in the second pumping stage may be the level of the input voltage Vin. Herein, the voltage difference of the fourth N-type transistor N4 may be Vds (drain-source voltage) of the fourth N-type transistor N4.

The second pumping stage may apply the inverted clock signal CKB of the logic high level to the gates of the first transistor T1 and the second transistor T2 and apply the clock signal CK of the logic low level to the gates of the third transistor T3 and the fourth transistor T4 to turn the second transistor T2 and the fourth transistor T4 on and turn the first transistor T1 and the third transistor T3 off. For example, in the pumping mode operation, the charge pump circuit 130 may control the voltage difference between a voltage applied to the one end of the fourth N-type transistor N4 and a voltage applied to the other end of the fourth N-type transistor N4 as the level of the input voltage Vin.

According to an embodiment, the second pumping stage may include the first inverter INV1 and the second inverter INV2 and, when the clock signal CK has the logic low level and the inverted clock signal CKB has the logic high level, control the second inverter INV2 to maintain the voltage difference between a voltage applied to the one end of the fourth N-type transistor N4 and a voltage applied to the other end of the fourth N-type transistor N4 at the level of the input voltage Vin.

Therefore, the charge pump circuit 130 according to an embodiment may control, as the input voltage Vin, the voltage difference between a voltage to be applied to the one end of the fourth N-type transistor N4 and a voltage to be applied to the other end of the fourth N-type transistor N4 used in the second pumping stage, thereby preventing device deterioration and ensuring reliability.

Figure 7:
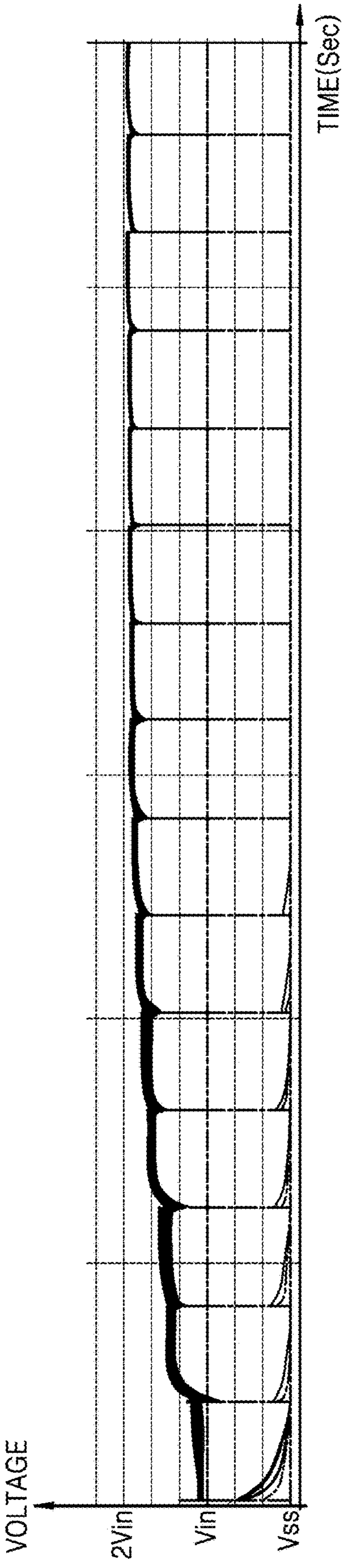
FIG. 7 is a graph illustrating the voltage of a charge pump circuit according to an embodiment.

FIG. 7 is a graph illustrating the voltage of a charge pump circuit according to an embodiment.

Referring to FIGS. 5 to 7, a timing diagram illustrating a voltage level change in the third N-type transistor N3 and/or the fourth N-type transistor N4 in an operation of the charge pump circuit is shown.

Referring to FIGS. 5 and 7, when the clock signal CK has the logic high level and the inverted clock signal CKB has the logic low level, the voltage level of the third node NO3 may be the level of the first voltage 2Vin and the voltage level of the one end of the third N-type transistor N3 may be the level of the input voltage Vin. For example, a voltage difference between a voltage applied to the one end of the third N-type transistor N3 and a voltage applied to the other end of the third N-type transistor N3 used in the second pumping stage 330 may be maintained at the input voltage Vin, thereby preventing device deterioration and ensuring reliability.

Referring to FIGS. 6 and 7, when the clock signal CK has the logic low level and the inverted clock signal CKB has the logic high level, the voltage level of the fourth node NO4 may be the level of the first voltage 2Vin and the voltage level of the one end of the fourth N-type transistor N4 may be the level of the input voltage Vin. For example, a voltage difference between a voltage applied to the one end of the fourth N-type transistor N4 and a voltage applied to the other end of the fourth N-type transistor N4 used in the second pumping stage 330 may be maintained at the input voltage Vin, thereby preventing device deterioration and ensuring reliability.

Referring to FIGS. 5 to 7, the first pumping stage 310, the first transmission stage 320, the second pumping stage 330, and the second transmission stage 340 may simultaneously operate for one clock cycle, and the output voltage Vout may be boosted to a target voltage (e.g., a high voltage corresponding to multiple times the input voltage Vin) in one clock cycle. For example, the charge pump circuit 130 according to an embodiment may receive both the clock signal CK and the inverted clock signal CKB to boost the input voltage Vin to the output voltage Vout, thereby minimizing a voltage loss and improving a pumping operation speed.

Figure 8:
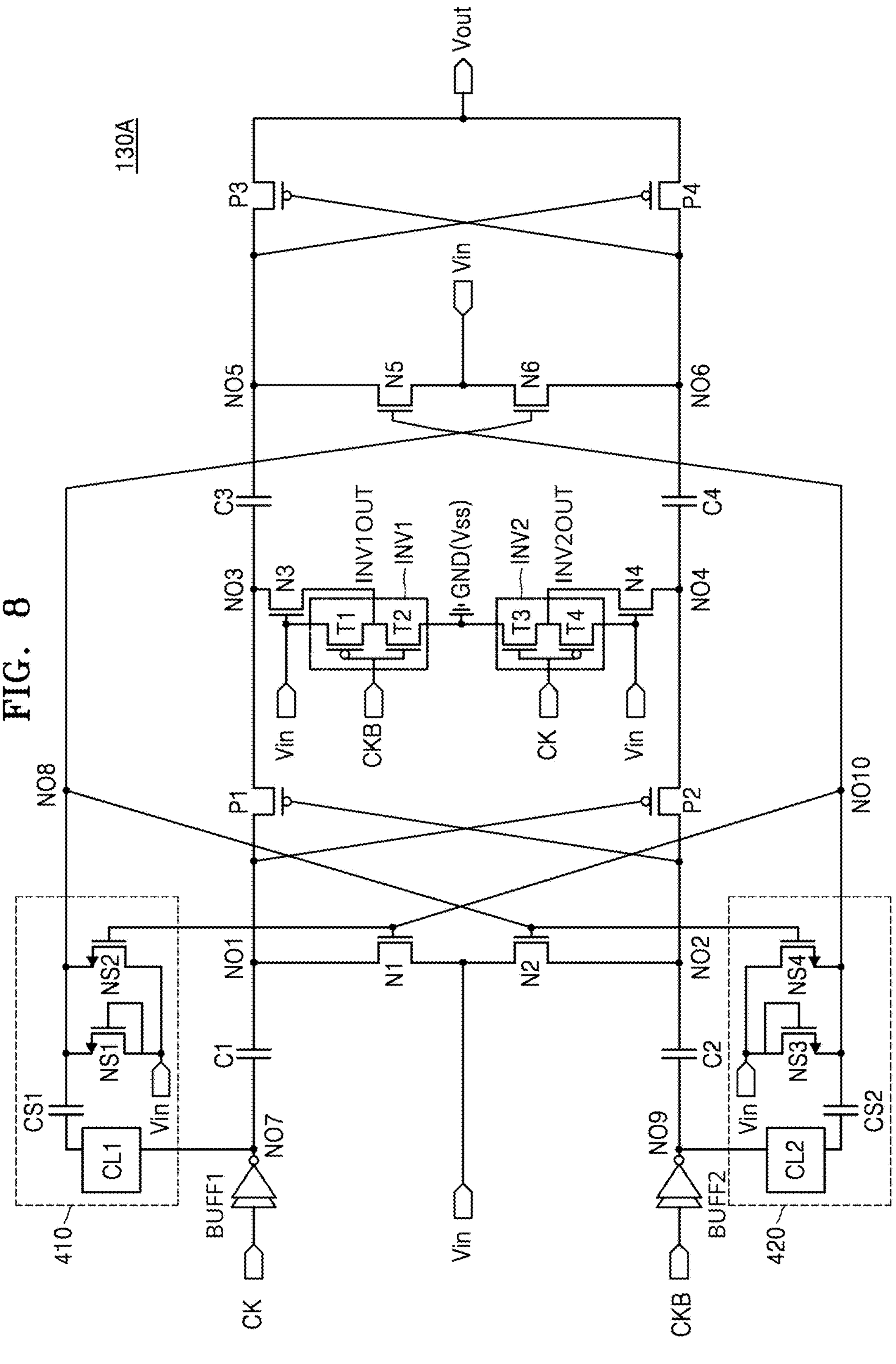
FIG. 8 is a circuit diagram illustrating a charge pump circuit including a sub-pumping circuit according to an embodiment.

FIG. 8 is a circuit diagram illustrating a charge pump circuit 130A including a sub-pumping circuit according to an embodiment. The description made with reference to FIG. 4 may be omitted herein.

The charge pump circuit 130A of FIG. 8 may correspond to the charge pump circuit 130 of FIG. 4. The charge pump circuit 130A of FIG. 8 may further include, in addition to the charge pump circuit 130 of FIG. 4, a first sub-pumping circuit 410 and a second sub-pumping circuit 420.

Referring to FIG. 8, the first sub-pumping circuit 410 may be connected between a seventh node NO7 and an eighth node NO8. The second sub-pumping circuit 420 may be connected between a ninth node NO9 and a tenth node NO10. The clock signal CK may be applied to the seventh node NO7 through the first buffer BUFF1, and the first pumping capacitor C1 may be connected between the seventh node NO7 and the first node NO1. The inverted clock signal CKB may be applied to the ninth node NO9 through the second buffer BUFF2, and the second pumping capacitor C2 may be connected between the ninth node NO9 and the second node NO2.

The first sub-pumping circuit 410 may include a first control logic CL1, a first sub-capacitor CS1, a first N-type sub-transistor NS1, and a second N-type sub-transistor NS2. One end of the first control logic CL1 may be connected to the seventh node NO7, and the other end of the first control logic CL1 may be connected to the first sub-capacitor CS1. One end of the first sub-capacitor CS1 may be connected to the first control logic CL1, and the other end of the first sub-capacitor CS1 may be connected to the eighth node NO8. One end of the first N-type sub-transistor NS1 may be connected to the eighth node NO8, and the input voltage Vin may be applied to the other end and the gate of the first N-type sub-transistor NS1. The second N-type sub-transistor NS2 may include one end connected to the eighth node NO8, the other end to which the input voltage Vin is applied, and a gate connected to the tenth node NO10. In addition, unlike the charge pump circuit 130 of FIG. 4, the gate of the first N-type transistor N1 and the gate of the fifth N-type transistor N5 may be connected to the tenth node NO10.

The second sub-pumping circuit 420 may include a second control logic CL2, a second sub-capacitor CS2, a third N-type sub-transistor NS3, and a fourth N-type sub-transistor NS4. One end of the second control logic CL2 may be connected to the ninth node NO9, and the other end of the second control logic CL2 may be connected to the second sub-capacitor CS2. One end of the second sub-capacitor CS2 may be connected to the second control logic CL2, and the other end of the second sub-capacitor CS2 may be connected to the tenth node NO10. One end of the third N-type sub-transistor NS3 may be connected to the tenth node NO10, and the input voltage Vin may be applied to the other end and the gate of the third N-type sub-transistor NS3. The fourth N-type sub-transistor NS4 may include one end connected to the tenth node NO10, the other end to which the input voltage Vin is applied, and a gate connected to the eighth node NO8. In addition, unlike the charge pump circuit 130 of FIG. 4, the gate of the second N-type transistor N2 and the gate of the sixth N-type transistor N6 may be connected to the eighth node NO8.

When the second pumping capacitor C2 and the fourth pumping capacitor C4 are in the pre-charge mode, the first sub-pumping circuit 410 may independently control the gate voltages of the second N-type transistor N2 and the sixth N-type transistor N6 to independently control the pre-charge timings of the second node NO2 and the sixth node NO6. For example, the first N-type sub-transistor NS1 and the second N-type sub-transistor NS2 may pre-charge the eighth node NO8 to the input voltage Vin. The first control logic CL1 may include a delay circuit. The first control logic CL1 may delay the clock signal CK and transmit the delayed clock signal CK to the first sub-capacitor CS1. When the delayed clock signal CK has the logic high level, the voltage level of the eighth node NO8 may be boosted to the first voltage 2Vin corresponding to twice the input voltage Vin. Accordingly, when the inverted clock signal CKB of the logic high level is applied to the ninth node NO9, the gate voltages of the second N-type transistor N2 and the sixth N-type transistor N6 may be maintained at the first voltage 2Vin corresponding to twice the input voltage Vin. Therefore, the first sub-pumping circuit 410 may prevent the occurrence of a reverse peak current when the second pumping capacitor C2 and the fourth pumping capacitor C4 switch from the pre-charge mode to the pumping mode. For example, the first sub-pumping circuit 410 may securely provide the first voltage 2Vin to the second N-type transistor N2 and the sixth N-type transistor N6, and then the first P-type transistor P1 and the third P-type transistor P3 may be completely turned off such that the output voltage Vout may not be reduced by the first P-type transistor P1 and the third P-type transistor P3. Accordingly, the pumping speed of the charge pump circuit 130A may increase.

When the first pumping capacitor C1 and the third pumping capacitor C3 are in the pre-charge mode, the second sub-pumping circuit 420 may independently control the gate voltages of the first N-type transistor N1 and the fifth N-type transistor N5 to independently control the pre-charge timings of the first node NO1 and the fifth node NO5. For example, the third N-type sub-transistor NS3 and the fourth N-type sub-transistor NS4 may pre-charge the tenth node NO10 to the input voltage Vin. The second control logic CL2 may include a delay circuit. The second control logic CL2 may delay the inverted clock signal CKB and transmit the delayed inverted clock signal CKB to the second sub-capacitor CS2. When the delayed inverted clock signal CKB has the logic high level, the voltage level of the tenth node NO10 may be boosted to the first voltage 2Vin corresponding to twice the input voltage Vin. Accordingly, when the clock signal CK of the logic high level is applied to the seventh node NO7, the gate voltages of the first N-type transistor N1 and the fifth N-type transistor N5 may be maintained as the first voltage 2Vin corresponding to twice the input voltage Vin. Therefore, the second sub-pumping circuit 420 may prevent the occurrence of a reverse peak current when the first pumping capacitor C1 and the third pumping capacitor C3 switch from the pre-charge mode to the pumping mode. For example, the second sub-pumping circuit 420 may securely provide the first voltage 2Vin to the first N-type transistor N1 and the fifth N-type transistor N5, and then the second P-type transistor P2 and the fourth P-type transistor P4 may be completely turned off such that the output voltage Vout may not be reduced by the second P-type transistor P2 and the fourth P-type transistor P4. Accordingly, the pumping speed of the charge pump circuit 130A may increase.

Figure 9:
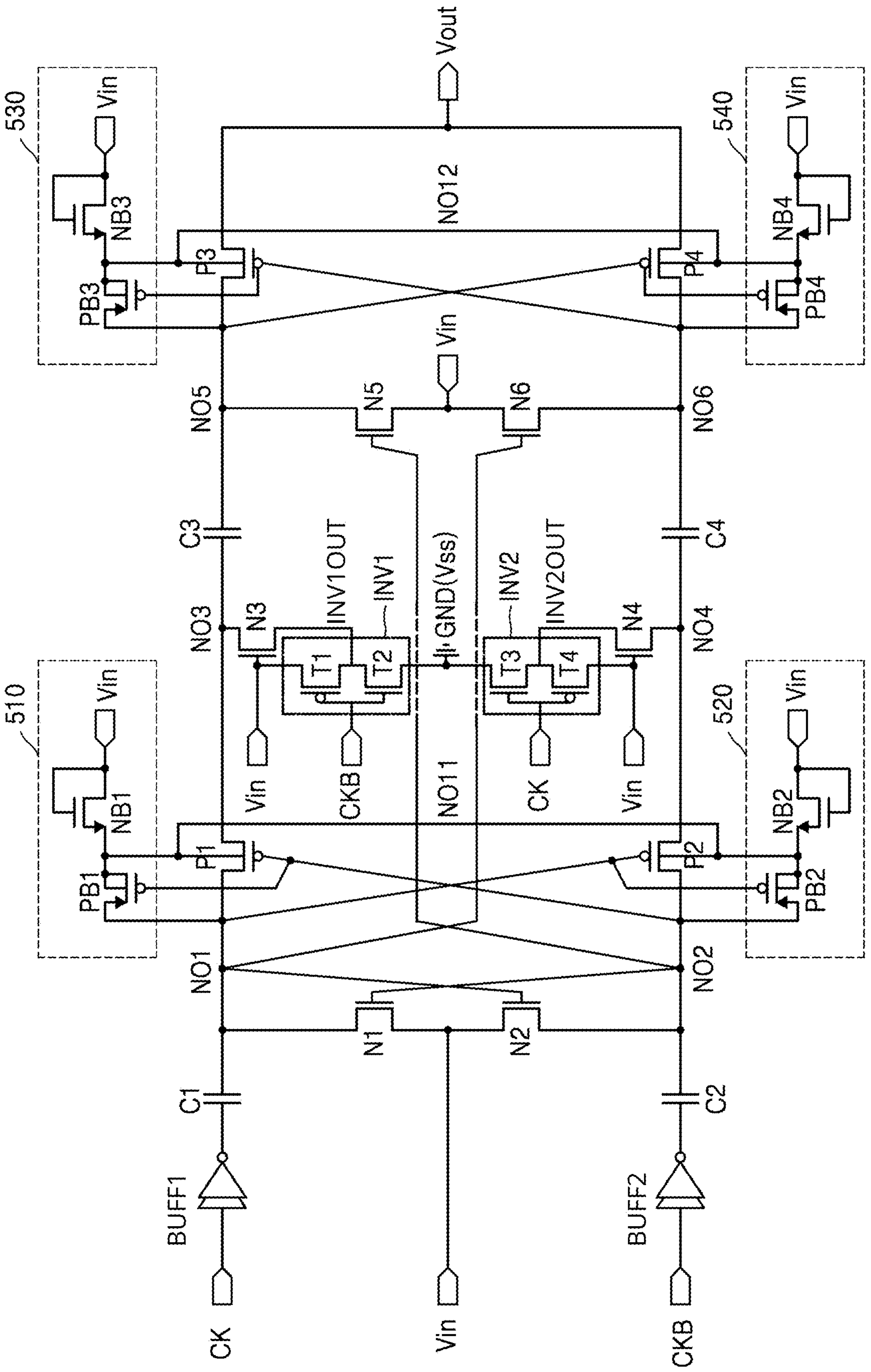
FIG. 9 is a circuit diagram illustrating a charge pump circuit including a body bias circuit according to an embodiment.

FIG. 9 is a circuit diagram illustrating a charge pump circuit 130B including a body bias circuit according to an embodiment. The description made with reference to FIG. 4 may be omitted herein.

The charge pump circuit 130B of FIG. 9 may correspond to the charge pump circuit 130 of FIG. 4. The charge pump circuit 130B of FIG. 9 may further include, in addition to the charge pump circuit 130 of FIG. 4, a first body bias circuit 510, a second body bias circuit 520, a third body bias circuit 530, and a fourth body bias circuit 540.

Referring to FIG. 9, the first body bias circuit 510 may be connected between the first node NO1 and an eleventh node NO11, the second body bias circuit 520 may be connected between the second node NO2 and the eleventh node NO11, the third body bias circuit 530 may be connected between the fifth node NO5 and a twelfth node NO12, and the fourth body bias circuit 540 may be connected between the sixth node NO6 and the twelfth node NO12. The eleventh node NO11 may be connected to the body of the first P-type transistor P1 and the body of the second P-type transistor P2. The twelfth NO12 may be connected to the body of the third P-type transistor P3 and the body of the fourth P-type transistor P4.

The first body bias circuit 510 may include a first P-type body transistor PB1 and a first N-type body transistor NB1. The first P-type body transistor PB1 may include one end connected to the first node NO1, the other end connected to the eleventh node NO11, and a gate connected to the second node NO2. One end of the first N-type body transistor NB1 may be connected to the eleventh node NO11, and the input voltage Vin may be applied to the other end and a gate of the first N-type body transistor NB1.

The second body bias circuit 520 may include a second P-type body transistor PB2 and a second N-type body transistor NB2. The second P-type body transistor PB2 may include one end connected to the second node NO2, the other end connected to the eleventh node NO11, and a gate connected to the first node NO1. One end of the second N-type body transistor NB2 may be connected to the eleventh node NO11, and the input voltage Vin may be applied to the other end and a gate of the second N-type body transistor NB2.

The third body bias circuit 530 may include a third P-type body transistor PB3 and a third N-type body transistor NB3. The third P-type body transistor PB3 may include one end connected to the fifth node NO5, the other end connected to the twelfth node NO12, and a gate connected to the sixth node NO6. One end of the third N-type body transistor NB3 may be connected to the twelfth node NO12, and the input voltage Vin may be applied to the other end and a gate of the third N-type body transistor NB3.

The fourth body bias circuit 540 may include a fourth P-type body transistor PB4 and a fourth N-type body transistor NB4. The fourth P-type body transistor PB4 may include one end connected to the sixth node NO6, the other end connected to the twelfth node NO12, and a gate connected to the fifth node NO5. One end of the fourth N-type body transistor NB4 may be connected to the twelfth node NO12, and the input voltage Vin may be applied to the other end and a gate of the fourth N-type body transistor NB4.

The first body bias circuit 510 may supply the input voltage Vin to the body of the first P-type transistor P1. The second body bias circuit 520 may supply the input voltage Vin to the body of the second P-type transistor P2. The third body bias circuit 530 may supply the input voltage Vin to the body of the third P-type transistor P3. The fourth body bias circuit 540 may supply the input voltage Vin to the body of the fourth P-type transistor P4.

A sufficient body bias voltage may be supplied to transmission transistors (e.g., the first to fourth P-type transistors P1 to P4). Accordingly, in a pumping mode operation, the voltage of a first pumping stage (e.g., the first pumping capacitor C1, the second pumping capacitor C2, the first N-type transistor N1, and the second N-type transistor N2) may be transmitted to a second pumping stage (e.g., the third pumping capacitor C3, the fourth pumping capacitor C4, the third N-type transistor N3, the fourth N-type transistor N4, the fifth N-type transistor N5, and the sixth N-type transistor N6) without loss through a first transmission stage (e.g., the first P-type transistor P1 and the second P-type transistor P2). In addition, the voltage of the second pumping stage may be transmitted to an output node without loss through a second transmission stage (e.g., the third P-type transistor P3 and the fourth P-type transistor P4).

Figure 10:
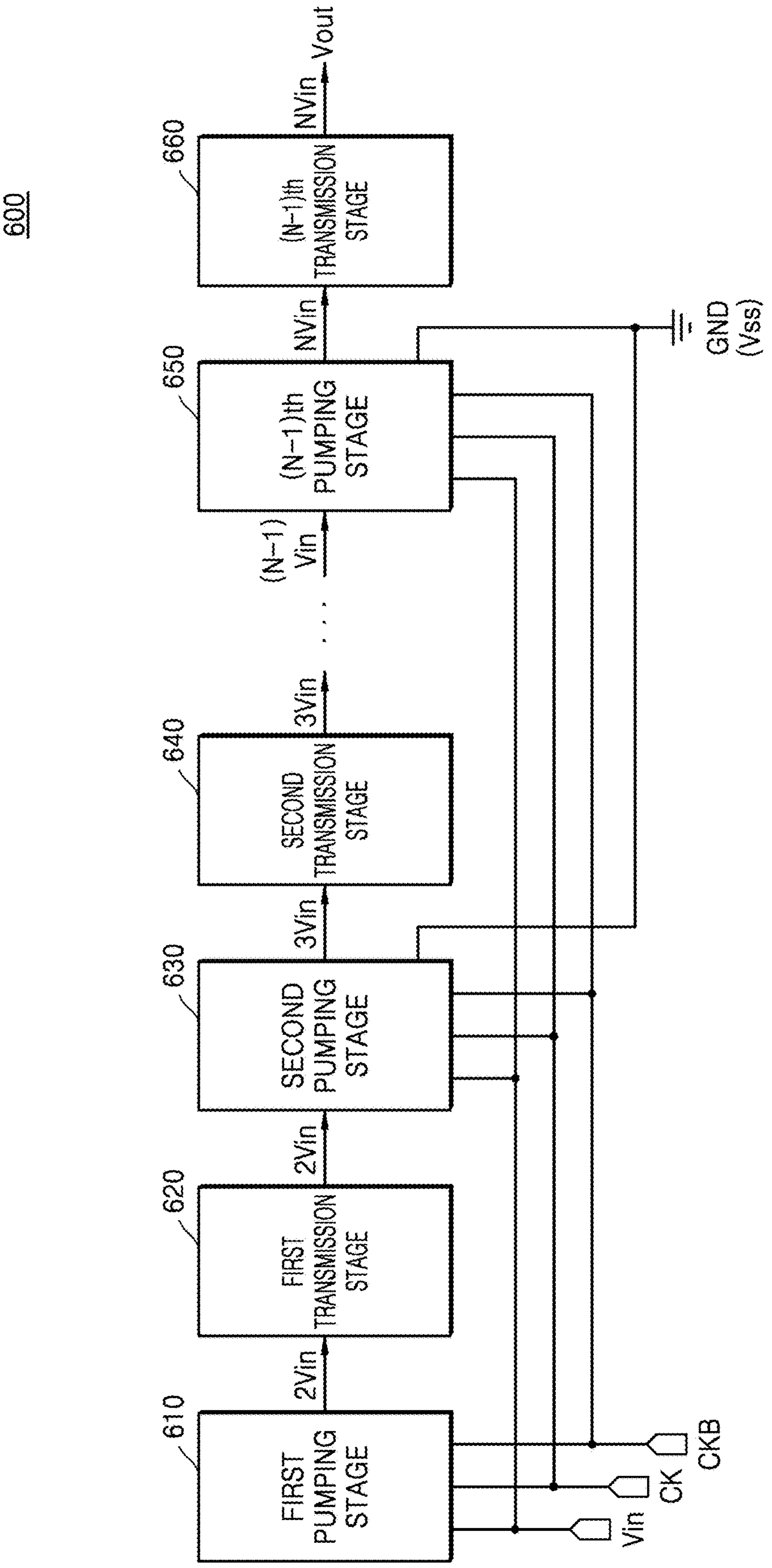
FIG. 10 is a block diagram illustrating a charge pump circuit according to an embodiment.

FIG. 10 is a block diagram illustrating a charge pump circuit 600 according to an embodiment. The description made with reference to FIG. 3 may be omitted herein.

Referring to FIG. 10, the charge pump circuit 600 may generate the output voltage Vout (e.g., NVin) corresponding to N times the input voltage Vin through N−1 pumping stages (e.g., a first pumping stage 610 to an (N−1)th pumping stage 650) and N−1 transmission stages (e.g., a first transmission stage 620 to an (N−1)th transmission stage 660). The input voltage Vin, the clock signal CK, and the inverted clock signal CKB may be applied to each pumping stage. Each of the pumping stages between the second pumping stage 630 and the (N−1)th pumping stage 650 may be connected to the ground node GND.

The first pumping stage 610 may transmit the first voltage 2Vin corresponding to twice the input voltage Vin to the first transmission stage 620. The first transmission stage 620 may transmit the first voltage 2Vin corresponding to twice the input voltage Vin to the second pumping stage 630. The second pumping stage 630 may transmit the second voltage 3Vin corresponding to three times the input voltage Vin to the second transmission stage 640. The second transmission stage 640 may transmit the second voltage 3Vin corresponding to three times the input voltage Vin to a subsequent pumping stage. Each of the pumping stages between the second pumping stage 630 and the (N−1)th pumping stage 650 may pump a voltage received from a previous transmission stage by the input voltage Vin and transmit the pumped voltage to a subsequent transmission stage. Each of the transmission stages between the second transmission stage 640 and the (N−1)th transmission stage 660 may transmit a voltage received from a previous pumping stage to a subsequent pumping stage as it is. The (N−1)th pumping stage 650 may transmit an (N−1)th voltage NVin corresponding to N times the input voltage Vin to the (N−1)th transmission stage 660. The (N−1)th transmission stage 660 may output the (N−1)th voltage NVin corresponding to N times the input voltage Vin to an output node. Herein, N is a natural number of 5 or greater.

According to an embodiment, all pumping stages and all transmission stages of the charge pump circuit 600 may simultaneously perform a pumping operation and a transmission operation for one clock cycle. A voltage less than or equal to the input voltage Vin may be applied to both ends of each pumping capacitor included in each pumping stage of the charge pump circuit 600. Therefore, deterioration of pumping capacitors included in the charge pump circuit 600 may be prevented, and the operation speed and reliability of the charge pump circuit 600 may be improved.

Some of the pumping capacitors included in the charge pump circuit 600 may operate in the pumping mode, and the rest thereof may operate in the pre-charge mode. Pumping capacitors operating in the pumping mode among the pumping capacitors included in the charge pump circuit 600 may be connected in series to each other.

The sub-pumping circuit (e.g., the first sub-pumping circuit 410 and the second sub-pumping circuit 420) of FIG. 8 may be additionally employed in each pumping stage of the charge pump circuit 600. In addition, the body bias circuit (e.g., the first body bias circuit 510, the second body bias circuit 520, the third body bias circuit 530, and the fourth body bias circuit 540) of FIG. 9 may be additionally employed in each transmission stage of the charge pump circuit 600.

Figure 11:
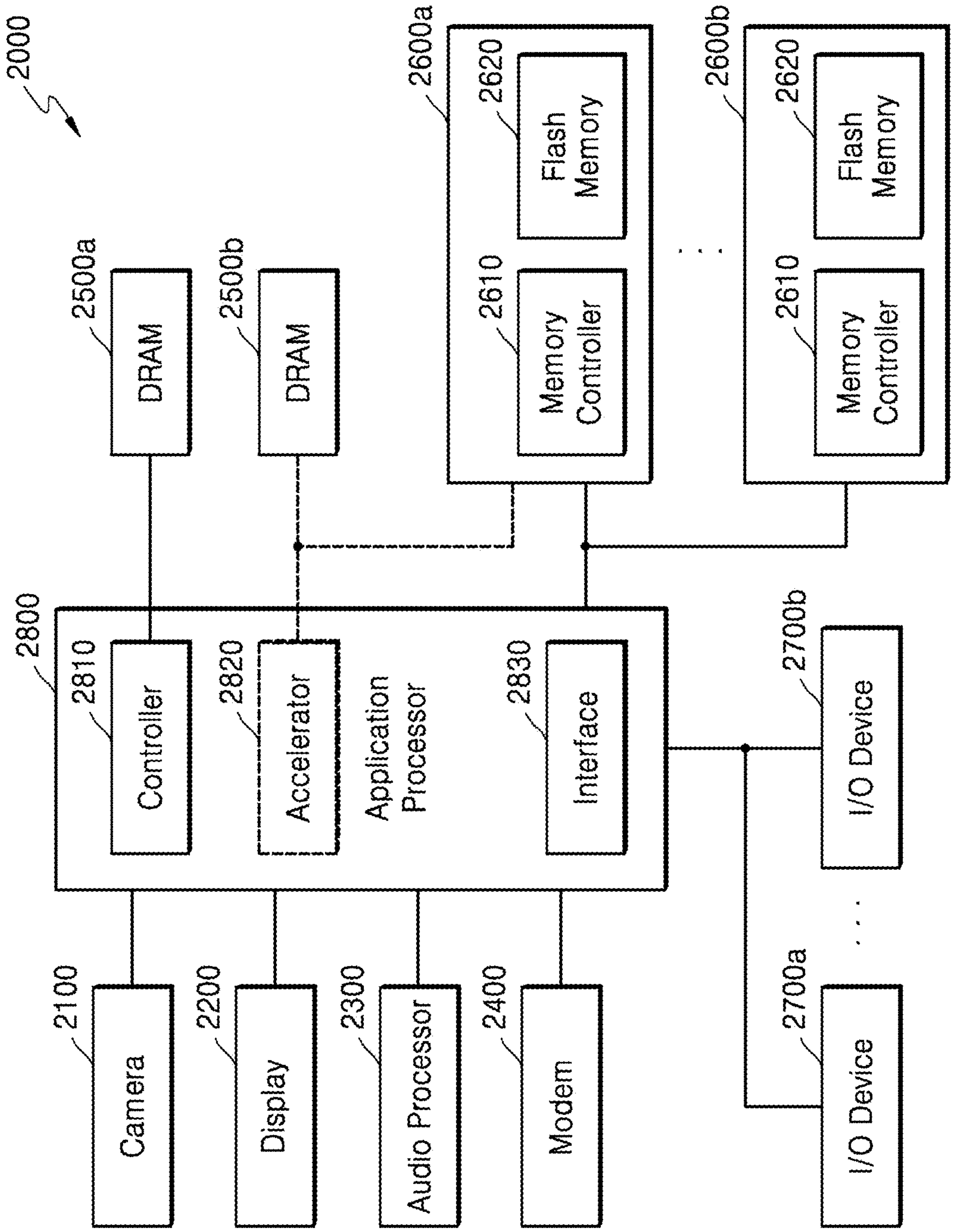
FIG. 11 is a block diagram illustrating a system for describing an electronic apparatus including a memory device according to an embodiment.

FIG. 11 is a block diagram illustrating a system 2000 for describing an electronic apparatus including a memory device according to an embodiment.

Referring to FIG. 11, the system 2000 may include a camera 2100, a display 2200, an audio processor 2300, a modem 2400, DRAMs 2500*a* and 2500*b*, flash memories 2600*a* and 2600*b*, input/output (I/O) devices 2700*a* and 2700*b*, and an AP 2800. The system 2000 may be implemented by a laptop computer, a mobile phone, a smartphone, a tablet personal computer (PC), a wearable device, a healthcare device, or an Internet of Things (IoT) device. Alternatively, the system 2000 may be implemented by a server or a PC.

The camera 2100 may capture a still image or a moving picture according to control by a user and store the captured image/video data therein or transmit the captured image/video data to the display 2200. The audio processor 2300 may process audio data included in content in the flash memories 2600*a* and 2600*b* or from a network. The modem 2400 may modulate and transmit a signal for wired/wireless data transmission and reception and demodulate a signal into an original signal at a reception side. The I/O devices 2700*a* and 2700*b* may include devices, such as a universal serial bus (USB), a storage, a digital camera, a secure digital (SD) card, a digital versatile disc (DVD), a network adapter, and a touch screen, configured to provide a digital input and/or output function.

The AP 2800 may control a general operation of the system 2000. The AP 2800 may include a control block 2810, an accelerator block or accelerator chip 2820, and an interface block 2830. The AP 2800 may control the display 2200 to display, on the display 2200, a portion of content stored in the flash memories 2600*a* and 2600*b*. If a user input is received through the I/O devices 2700*a* and 2700*b*, the AP 2800 may perform a control operation corresponding to the user input. The AP 2800 may include the accelerator block 2820 that is an exclusive circuit for artificial intelligence (AI) data computation, or the accelerator chip 2820 may be provided separately from the AP 2800. The DRAM 2500*b* may be additionally mounted in the accelerator block or accelerator chip 2820. An accelerator is a function block configured to professionally perform a particular function of the AP 2800 and may include a GPU that is a function block configured to professionally perform graphics data processing, a neural processing unit (NPU) that is a block configured to professionally perform AI computation and inference, and a data processing unit (DPU) that is a block configured to professionally perform data transmission.

The system 2000 may include a plurality of DRAMs 2500*a* and 2500*b*. The AP 2800 may control the DRAMs 2500*a* and 2500*b* through a command and a mode register set (MRS) according to a Joint Electron Device Engineering Council (JEDEC) standard or communicate with the DRAMs 2500*a* and 2500*b* by setting a DRAM interface protocol to use company-specific functions, such as low voltage/high speed/reliability and the like, and a cyclic redundancy check (CRC)/error correction code (ECC) function. For example, the AP 2800 may communicate with the DRAM 2500*a* by using an interface, which meets a JEDEC standard, such as low power double data rate 4 (LPDDR4) or LPDDR5, and the accelerator block or accelerator chip 2820 may communicate with the DRAM 2500*b* by setting a new DRAM interface protocol to control the DRAM 2500*b* having a higher bandwidth than the DRAM 2500*a*, the DRAM 2500*b* being for an accelerator.

Although FIG. 11 shows only the DRAMs 2500*a* and 2500*b*, the present invention is not limited thereto, and only if the bandwidth, the reaction speed, and the voltage conditions of the AP 2800 or the accelerator chip 2820 are satisfied, any memory, such as parameter random access memory (PRAM), static random access memory (SRAM), magnetic random access memory (MRAM), resistive random access memory (RRAM), ferroelectric random access memory (FRAM), or hybrid RAM, may be used. The DRAMs 2500*a* and 2500*b* have a relatively less latency and bandwidth than the I/O devices 2700*a* and 2700*b* or the flash memories 2600*a* and 2600*b*. The DRAMs 2500*a* and 2500*b* may be initialized at a power-on time point of the system 2000 and used as a temporary storage of an operating system and application data by loading the operating system and the application data thereon or used as an execution space of various kinds of software codes.

In the DRAMs 2500*a* and 2500*b*, the four fundamental arithmetic operations of addition/subtraction/multiplication/division, a vector operation, an address calculation, or a fast Fourier transform (FFT) operation may be performed. In addition, in the DRAMs 2500*a* and 2500*b*, a functional function for execution used for inference may be performed. Herein, inference may be performed by a deep learning algorithm using an artificial neural network. The deep learning algorithm may include a training operation of training a model through various pieces of data and an inference operation of recognizing data by using the trained model. In an embodiment, an image captured by a user through the camera 2100 may be signal-processed and stored in the DRAM 2500*b*, and the accelerator block or accelerator chip 2820 may perform an AI data computation for recognizing data by using data stored in the DRAM 2500*b* and a function used for inference.

The system 2000 may include a plurality of storages 2600*a* and 2600*b* having a greater capacity than the DRAMs 2500*a* and 2500*b*. The accelerator block or accelerator chip 2820 may perform the training operation and an AI data computation by using the plurality of storages 2600*a* and 2600*b*. In an embodiment, each of the plurality of storages 2600*a* and 2600*b* may include a memory controller 2610 and a flash memory device 2620 and relatively efficiently perform, by using a computation device included in the memory controller 2610, the training operation and an inference AI data computation to be performed by the AP 2800 and/or the accelerator chip 2820. The flash memories 2600*a* and 2600*b* may store pictures taken through the camera 2100 or store data received through a data network. For example, augmented reality/virtual reality, high definition (HD), or ultra high definition (UHD) content may be stored in the flash memories 2600*a* and 2600*b*.

In the system 2000, the DRAMs 2500*a* and 2500*b* may be implemented by an embodiment of a memory device described with reference to FIGS. 1 to 10. A memory device may include a charge pump circuit, and the charge pump circuit may include a circuit area reduced compared to an existing cross-coupled charge pump circuit.

In addition, in a charge pump circuit of a memory device according to an embodiment, a second pumping stage may include a first inverter and a second inverter. For example, when a clock signal has the logic high level and an inverted clock signal has the logic low level, the charge pump circuit may control the first inverter and the second inverter to maintain the voltage difference between a voltage applied to one end of a third N-type transistor and a voltage applied to the other end of the third N-type transistor at an input voltage. For example, when the clock signal has the logic low level and the inverted clock signal has the logic high level, the charge pump circuit may control the first inverter and the second inverter to maintain the voltage difference between a voltage applied to one end of a fourth N-type transistor and a voltage applied to the other end of the fourth N-type transistor at the input voltage.

Therefore, the charge pump circuit may control the voltage level of the third N-type transistor and/or the fourth N-type transistor used in the second pumping stage as the input voltage, thereby preventing device deterioration and ensuring reliability.

While the inventive concept has been particularly shown and described with reference to embodiments thereof, it will be understood that various changes in form and details may be made therein without departing from the spirit and scope of the present invention as defined by the following claims.

What is claimed is:

1. A charge pump circuit comprising:

a plurality of pumping stages including a first pumping stage and a second pumping stage; and a plurality of transmission stages including a first transmission stage and a second transmission stage, wherein:

the first pumping stage includes:

a first pumping capacitor having one end to which a clock signal is applied and the other end connected to a first node;

a second pumping capacitor having one end to which an inverted clock signal is applied and the other end connected to a second node;

a first N-type transistor including a first end connected to the first node, a second end to which an input voltage is applied, and a gate to which the input voltage or a first voltage having twice a level of the input voltage is applied; and a second N-type transistor including a first end connected to the second node, a second end to which the input voltage is applied, and a gate to which the input voltage or the first voltage is applied, the first transmission stage is configured to transmit a voltage of the first node to a third node in response to the clock signal having a logic high level, and transmit a voltage of the second node to a fourth node in response to the inverted clock signal having the logic high level, the second pumping stage includes:

a third pumping capacitor having one end connected to the third node and the other end connected to a fifth node;

a fourth pumping capacitor having one end connected to the fourth node and the other end connected to a sixth node;

a first inverter and a second inverter;

a third N-type transistor including a first end connected to the third node and a second end connected to an output node of the first inverter; and a fourth N-type transistor including a first end connected to the fourth node and a second end connected to an output node of the second inverter, the second transmission stage is configured to transmit a voltage of the fifth node to an output node of the charge pump circuit in response to the clock signal having the logic high level, and transmit a voltage of the sixth node to the output node of the charge pump circuit in response to the inverted clock signal having the logic high level, in response to the clock signal having the logic high level and the inverted clock signal having a logic low level, a voltage difference between a voltage applied to the first end of the third N-type transistor and a voltage applied to the second end of the third N-type transistor is the same as the level of the input voltage, and a voltage difference between a voltage the first end of the fourth N-type transistor and the second end of the fourth N-type transistor is the same as a level of a ground voltage, and in response to the clock signal having the logic low level and the inverted clock signal having the logic high level, the voltage difference between a voltage applied to the first end of the third N-type transistor and a voltage applied to the second end of the third N-type transistor is the same as the level of the ground voltage, and the voltage difference between a voltage applied to the first end of the fourth N-type transistor and a voltage applied to the second end of the fourth N-type transistor is the same as the level of the input voltage.

2. The charge pump circuit of claim 1, wherein the first inverter includes:

a first transistor including a first end to which the input voltage is applied, a second end connected to the second end of the third N-type transistor, and a gate to which the inverted clock signal is applied; and a second transistor including a first end to which the ground voltage is applied, a second end connected to the second end of the third N-type transistor, and a gate to which the inverted clock signal is applied, and wherein the second inverter includes:

a third transistor including a first end to which the ground voltage is applied, a second end connected to the second end of the fourth N-type transistor, and a gate to which the clock signal is applied; and a fourth transistor including a first end to which the input voltage is applied, a second end connected to the second end of the fourth N-type transistor, and a gate to which the clock signal is applied.

3. The charge pump circuit of claim 2, wherein, in response to the clock signal having the logic high level:

the first pumping capacitor is configured to pump the input voltage to the first voltage at the first node, a voltage level of the third node is the same as a level of the first voltage, the third pumping capacitor configured to pump the voltage of the third node to a second voltage having three times the level of the input voltage at the fifth node, and the voltage difference between a voltage applied to the first end of the third N-type transistor and a voltage applied to the second end of the third N-type transistor is the same as the level of the input voltage in response to turning off of the third N-type transistor and turning on of the first transistor.

4. The charge pump circuit of claim 2, wherein the second pumping stage further includes:

a sixth N-type transistor including a first end connected to the sixth node, a second end to which the input voltage is applied, and a gate connected to the gate of the second N-type transistor, and wherein, in response to the inverted clock signal having the logic low level:

the second pumping capacitor and the fourth pumping capacitor are configured to operate in a pre-charge mode, the second N-type transistor is configured to pre-charge the second node to the input voltage, and the fourth N-type transistor is configured to pre-charge the fourth node to the ground voltage through the third transistor.

5. The charge pump circuit of claim 2, wherein the second pumping stage further includes:

a fifth N-type transistor including a first end connected to the fifth node, a second end to which the input voltage is applied, and a gate connected to the gate of the first N-type transistor, and wherein, in response to the clock signal having the logic low level:

the first pumping capacitor and the third pumping capacitor are configured to operate in a pre-charge mode, the first N-type transistor is configured to pre-charge the first node to the input voltage, and the third N-type transistor is configured to pre-charge the third node to the ground voltage through the second transistor.

6. The charge pump circuit of claim 2, wherein, in response to the inverted clock signal having the logic high level:

the second pumping capacitor is configured to pump the input voltage to the first voltage at the second node, a voltage level of the fourth node is the same as a level of the first voltage, the fourth pumping capacitor configured to pump the voltage of the fourth node to a second voltage having three times the level of the input voltage at the sixth node, and the voltage difference between a voltage applied to the first end of the fourth N-type transistor and a voltage applied to the second end of the fourth N-type transistor is the same as the level of the input voltage in response to turning off of the fourth N-type transistor and turning on of the fourth transistor.

7. The charge pump circuit of claim 2, wherein each of the first transistor and the fourth transistor includes a P-type transistor, and wherein each of the second transistor and the third transistor includes a N-type transistor.

8. The charge pump circuit of claim 1, wherein the second pumping stage further includes:

a fifth N-type transistor including a first end connected to the fifth node, a second end to which the input voltage is applied, and a gate connected to the second node; and a sixth N-type transistor including a first end connected to the sixth node, a second end to which the input voltage is applied, and a gate connected to the first node.

9. The charge pump circuit of claim 1, wherein the first transmission stage includes:

a first P-type transistor including a first end connected to the first node, a second end connected to the third node, and a gate connected to the second node; and a second P-type transistor including a first end connected to the second node, a second end connected to the fourth node, and a gate connected to the first node.

10. The charge pump circuit of claim 1, wherein the second transmission stage includes:

a third P-type transistor including a first end connected to the fifth node, a second end connected to the output node of the charge pump circuit, and a gate connected to the sixth node; and a fourth P-type transistor including a first end connected to the sixth node, a second end connected to the output node of the charge pump circuit, and a gate connected to the fifth node.

11. A memory device comprising:

a memory cell array including a plurality of memory cells; and a peripheral circuit including a charge pump circuit configured to receive a power source voltage from outside the memory device and generate a high voltage corresponding to multiple times the power source voltage, wherein:

the charge pump circuit includes a plurality of pumping stages including a first pumping stage and a second pumping stage, and a plurality of transmission stages including a first transmission stage and a second transmission stage, the first pumping stage includes:

a first pumping capacitor having one end to which a clock signal is applied and the other end connected to a first node;

a second pumping capacitor having one end to which an inverted clock signal is applied and the other end connected to a second node;

a first N-type transistor including a first end connected to the first node, a second end to which an input voltage is applied, and a gate to which the input voltage or a first voltage having twice a level of the input voltage is applied; and a second N-type transistor including a first end connected to the second node, a second end to which the input voltage is applied, and a gate to which the input voltage or the first voltage is applied, the first transmission stage is configured to transmit a voltage of the first node to a third node in response to the clock signal having a logic high level, and transmit a voltage of the second node to a fourth node in response to the inverted clock signal having the logic high level, the second pumping stage includes:

a third pumping capacitor having one end connected to the third node and the other end connected to a fifth node;

a fourth pumping capacitor having one end connected to the fourth node and the other end connected to a sixth node;

a first inverter and a second inverter;

a third N-type transistor including a first end connected to the third node and a second end connected to an output node of the first inverter; and a fourth N-type transistor including a first end connected to the fourth node and a second end connected to an output node of the second inverter, the second transmission stage is configured to transmit a voltage of the fifth node to an output node of the charge pump circuit in response to the clock signal having the logic high level, and transmit a voltage of the sixth node to the output node of the charge pump circuit in response to the inverted clock signal having the logic high level, in response to the clock signal having the logic high level and the inverted clock signal having a logic low level, a voltage difference between a voltage applied to the first end of the third N-type transistor and a voltage applied to the second end of the third N-type transistor is the same as the level of the input voltage, and a voltage difference between the first end of the fourth N-type transistor and the second end of the fourth N-type transistor is the same as a level of a ground voltage, and in response to the clock signal having the logic low level and the inverted clock signal having the logic high level, the voltage difference between a voltage applied to the first end of the third N-type transistor and a voltage applied to the second end of the third N-type transistor is the same as the level of the ground voltage, and the voltage difference between a voltage applied to the first end of the fourth N-type transistor and a voltage applied to the second end of the fourth N-type transistor is the same as the level of the input voltage.

12. The memory device of claim 11, further comprising:

a first sub-pumping circuit configured to control level change timings of the second node and the sixth node to be different from a level change timing of the clock signal, based on the clock signal; and a second sub-pumping circuit configured to control level change timings of the first node and the fifth node to be different from a level change timing of the inverted clock signal, based on the inverted clock signal.

13. The memory device of claim 12, wherein the first sub-pumping circuit includes:

a first control logic connected to a seventh node connected to the one end of the first pumping capacitor;

a first sub-capacitor having one end connected to the first control logic;

a first N-type sub-transistor including a first end connected to the other end of the first sub-capacitor, a second end and a gate to which the input voltage is applied; and a second N-type sub-transistor including a first end connected to the other end of the first sub-capacitor, a second end to which the input voltage is applied, and a gate connected to the gate of the first N-type transistor, and the second sub-pumping circuit includes:

a second control logic connected to a ninth node connected to the one end of the second pumping capacitor;

a second sub-capacitor having one end connected to the second control logic;

a third N-type sub-transistor including a first end connected to the other end of the second sub-capacitor, a second end and a gate to which the input voltage is applied; and a fourth N-type sub-transistor including a first end connected to the other end of the second sub-capacitor, a second end to which the input voltage is applied, and a gate connected to the gate of the second N-type transistor.

14. The memory device of claim 11, wherein the memory device is configured such that the first pumping stage, the first transmission stage, the second pumping stage, and the second transmission stage simultaneously operate for one cycle of the clock signal or the inverted clock signal.

15. The memory device of claim 11, wherein, in a pumping mode or pre-charge mode operation, a voltage difference between both ends of each of the first pumping capacitor, the second pumping capacitor, the third pumping capacitor, and the fourth pumping capacitor is maintained as a magnitude less than or equal to the input voltage.

16. The memory device of claim 11, wherein the peripheral circuit includes:

a control logic configured to receive the clock signal, the power source voltage, and a core power source voltage and generate the inverted clock signal based on the clock signal;

the charge pump circuit configured to generate a word line enable voltage corresponding to multiple times the core power source voltage;

a row decoder configured to select a word line of the memory cell array based on the word line enable voltage; and an input and output circuit connected to the memory cell array through a bit line and configured to input and output data in and from the memory cell array.

17. The memory device of claim 11, wherein the first inverter includes:

a first transistor including a first end to which the input voltage is applied, a second end connected to the second end of the third N-type transistor, and a gate to which the inverted clock signal is applied; and a second transistor including a first end to which the ground voltage is applied, a second end connected to the second end of the third N-type transistor, and a gate to which the inverted clock signal is applied, and wherein the second inverter includes:

a third transistor including a first end to which the ground voltage is applied, a second end connected to the second end of the fourth N-type transistor, and a gate to which the clock signal is applied; and a fourth transistor including a first end to which the input voltage is applied, a second end connected to the second end of the fourth N-type transistor, and a gate to which the clock signal is applied.

18. The memory device of claim 17, wherein, in response to the clock signal having the logic high level:

the first pumping capacitor is configured to pump the input voltage to the first voltage at the first node, a voltage level of the third node is the same as a level of the first voltage, the third pumping capacitor configured to pump the voltage of the third node to a second voltage having three times the level of the input voltage at the fifth node, and the voltage difference between a voltage applied to the first end of the third N-type transistor and a voltage applied to the second end of the third N-type transistor is the same as the level of the input voltage in response to turning off of the third N-type transistor and turning on of the first transistor.

19. The memory device of claim 17, wherein, in response to the inverted clock signal having the logic high level:

the second pumping capacitor is configured to pump the input voltage to the first voltage at the second node, a voltage level of the fourth node is the same as a level of the first voltage, the fourth pumping capacitor configured to pump the voltage of the fourth node to a second voltage having three times the level of the input voltage at the sixth node, and the voltage difference between a voltage applied to the first end of the fourth N-type transistor and a voltage applied to the second end of the fourth N-type transistor is the same as the level of the input voltage in response to turning off of the fourth N-type transistor and turning on of the fourth transistor.

20. A charge pump circuit comprising:

a plurality of pumping stages including a first pumping stage and a second pumping stage; and a plurality of transmission stages including a first transmission stage and a second transmission stage, wherein:

the first pumping stage includes:

a first pumping capacitor having one end to which a clock signal is applied and the other end connected to a first node;

a second pumping capacitor having one end to which an inverted clock signal is applied and the other end connected to a second node;

a first N-type transistor including a first end connected to the first node, a second end to which an input voltage is applied, and a gate to which the input voltage or a first voltage having twice a level of the input voltage is applied; and a second N-type transistor including a first end connected to the second node, a second end to which the input voltage is applied, and a gate to which the input voltage or the first voltage is applied, the first transmission stage is configured to transmit a voltage of the first node to a third node in response to the clock signal having a logic high level, and transmit a voltage of the second node to a fourth node in response to the inverted clock signal having the logic high level, the second pumping stage includes:

a third pumping capacitor having one end connected to the third node and the other end connected to a fifth node;

a fourth pumping capacitor having one end connected to the fourth node and the other end connected to a sixth node;

a first inverter and a second inverter;

a third N-type transistor including a first end connected to the third node and a second end connected to an output node of the first inverter; and a fourth N-type transistor including a first end connected to the fourth node and a second end connected to an output node of the second inverter, the second transmission stage is configured to transmit a voltage of the fifth node to an output node of the charge pump circuit in response to the clock signal having the logic high level, and transmit a voltage of the sixth node to the output node of the charge pump circuit in response to the inverted clock signal having the logic high level, the first inverter includes:

a first transistor including a first end to which the input voltage is applied, a second end connected to the second end of the third N-type transistor, and a gate to which the inverted clock signal is applied; and a second transistor including a first end to which a ground voltage is applied, a second end connected to the second end of the third N-type transistor, and a gate to which the inverted clock signal is applied, the second inverter includes:

a third transistor including a first end to which the ground voltage is applied, a second end connected to the second end of the fourth N-type transistor, and a gate to which the clock signal is applied; and a fourth transistor including a first end to which the input voltage is applied, a second end connected to the second end of the fourth N-type transistor, and a gate to which the clock signal is applied, in response to the clock signal having the logic high level and the inverted clock signal having a logic low level, a voltage difference between a voltage applied to the first end of the third N-type transistor and a voltage applied to the second end of the third N-type transistor is the same as the level of the input voltage, and a voltage difference between a voltage applied to the first end of the fourth N-type transistor and a voltage applied to the second end of the fourth N-type transistor is the same as a level of the ground voltage, and in response to the clock signal having the logic low level and the inverted clock signal having the logic high level, the voltage difference between a voltage applied to the first end of the third N-type transistor and a voltage applied to the second end of the third N-type transistor is the same as the level of the ground voltage, and the voltage difference between a voltage applied to the first end of the fourth N-type transistor and a voltage applied to the second end of the fourth N-type transistor is the same as the level of the input voltage.

* * * * *